(12) United States Patent
Maekawa et al.

(10) Patent No.: US 9,813,665 B2
(45) Date of Patent: *Nov. 7, 2017

(54) CAMERA UNIT AND SENSING DEVICE

(71) Applicant: Ricoh Company, Ltd., Tokyo (JP)

(72) Inventors: Hiroshi Maekawa, Kanagawa (JP);
Norihiko Sasaki, Iwate (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/173,972

(22) Filed: Jun. 6, 2016

(65) Prior Publication Data

US 2016/0286162 A1   Sep. 29, 2016

Related U.S. Application Data

(63) Continuation of application No. 14/167,004, filed on Jan. 29, 2014, now Pat. No. 9,369,613, which is a (Continued)

(30) Foreign Application Priority Data

Aug. 3, 2009 (JP) .................................. 2009-180274

(51) Int. Cl.
*H04N 7/18* (2006.01)
*H04N 7/00* (2011.01)
(Continued)

(52) U.S. Cl.
CPC .............. *H04N 7/102* (2013.01); *B60R 1/00* (2013.01); *B60R 11/04* (2013.01); *H04N 5/2251* (2013.01);
(Continued)

(58) Field of Classification Search
CPC ... H04N 7/00; H04N 7/18; H04N 7/183; H04N 5/2251; H04N 5/2252; H04N 5/2253; H04N 5/2257; H05K 9/002
(Continued)

(56) References Cited

U.S. PATENT DOCUMENTS 4,868,646 A * 9/1989 Tsuji .................. H04N 5/23203
348/372
5,418,505 A * 5/1995 Agarwal ................. H01P 5/085
333/246
(Continued)

FOREIGN PATENT DOCUMENTS

JP   2001-015219   1/2001
JP   2002-044837   2/2002
(Continued)

OTHER PUBLICATIONS

Japanese Office Action dated May 27, 2013.
Japanese Office Action dated Jan. 16, 2015.

*Primary Examiner* — Farzana Huq
(74) *Attorney, Agent, or Firm* — IPUSA, PLLC

(57) ABSTRACT

A camera unit includes: an image sensor; a circuit board in which a signal processor circuit to process an output signal of the image sensor is formed; a cable including at least a signal conductor element and a ground conductor element and connected at one end to the circuit board; a metal housing component to accommodate the image sensor and the circuit board therein; and a metal component disposed at the end of the cable and connected to the ground conductor element. The ground conductor element is connected to both a ground terminal of the circuit board and the metal housing component in a vicinity of the end of the cable where the cable is connected to the circuit board. The ground conduc-
(Continued)

tor element is connected to the metal housing component through the metal component in the vicinity of the end of the cable.

12 Claims, 39 Drawing Sheets

Related U.S. Application Data continuation of application No. 12/846,993, filed on Jul. 30, 2010, now Pat. No. 8,681,220.

(51) Int. Cl.
| | | |
|---|---|---|
| H04N 7/10 | (2006.01) | |
| B60R 11/04 | (2006.01) | |
| H05K 9/00 | (2006.01) | |
| B60R 1/00 | (2006.01) | |
| H04N 5/232 | (2006.01) | |
| H04N 5/225 | (2006.01) | |

(52) U.S. Cl.
CPC ....... *H04N 5/2252* (2013.01); *H04N 5/23293* (2013.01); *H04N 7/183* (2013.01); *H05K 9/002* (2013.01); *B60R 2300/105* (2013.01); *B60R 2300/802* (2013.01); *H04N 5/2253* (2013.01); *H04N 5/2257* (2013.01); *H04N 7/18* (2013.01)

(58) Field of Classification Search
USPC ........ 348/118, 128, 148, 294, 373, 374, 375
See application file for complete search history.

(56) References Cited

U.S. PATENT DOCUMENTS

| | | |
|---|---|---|
| 5,552,753 A | 9/1996 | Agarwal et al. |
| 5,957,727 A | 9/1999 | Page, Jr. |
| 6,554,623 B2 | 4/2003 | Yoshioka |
| 2003/0043524 A1 | 3/2003 | Shikano et al. |
| 2004/0085444 A1* | 5/2004 | Ho .................. H04N 7/185 348/143 |
| 2009/0120682 A1* | 5/2009 | Ohtsuji ............ H01R 13/648 174/359 |
| 2010/0041268 A1 | 2/2010 | Okada et al. |
| 2010/0097519 A1 | 4/2010 | Byrne et al. |
| 2011/0249120 A1 | 10/2011 | Bingle et al. |

FOREIGN PATENT DOCUMENTS

| | | |
|---|---|---|
| JP | 2005-347243 | 12/2005 |
| JP | 3802742 | 7/2006 |
| JP | 2006-351229 | 12/2006 |
| JP | 2007-004068 | 1/2007 |
| JP | 2007-022364 | 2/2007 |
| JP | 2007-288444 | 11/2007 |
| JP | 2008-271504 | 11/2008 |

* cited by examiner

BRANCH LINE

CAMERA UNIT AND SENSING DEVICE

CROSS-REFERENCE TO RELATED APPLICATION

This application is a continuation patent application of, and claims the benefit of and priority to U.S. patent application Ser. No. 14/167,004 filed on Jan. 29, 2014 that is a continuation patent application of, and claims the benefit of and priority to U.S. patent application Ser. No. 12/846,993 filed on Jul. 30, 2010, which is based on and claims the benefit of priority of Japanese Patent Application No. 2009-180274, filed on Aug. 3, 2009, with the Japanese Patent Office, the entire contents of which are hereby incorporated by reference.

BACKGROUND OF THE INVENTION

1. Field of the Invention

The present disclosure relates to a camera unit which outputs an image signal, and relates to a sensing device including a camera unit which outputs an image signal.

2. Description of the Related Art

An in-vehicle camera which is used in an automotive vehicle is externally attached to the vehicle, and it is required that the in-vehicle camera has a high waterproofing performance although the in-vehicle camera is small in size. A cable needed for the wiring that connects the in-vehicle camera and a display unit internally arranged in the vehicle is almost about 10 m long.

Generally, an automotive vehicle includes several sources of electromagnetic waves, such as an engine and motors. Electromagnetic waves emitted from such sources may affect the in-vehicle camera through the cable, such that noise is superimposed on an image captured by the camera. Conversely, under the influence of electromagnetic waves emitted from the in-vehicle camera, an in-vehicle radio unit may be affected through the cable, such that sound generated by the radio unit becomes noisy. To eliminate the problem, it is important to take measures against electromagnetic interference (EMI) for the in-vehicle camera.

Moreover, it is required that the in-vehicle camera normally operates under severe environmental conditions. When dry conditions are intense, such as in winter, and a user's hand touches the in-vehicle camera, electrostatic discharge occurs frequently. To protect the in-vehicle camera from electrostatic discharge, it is required that the in-vehicle camera has a high resistance to electrostatic discharge.

Japanese Laid-Open Patent Publication No. 2005-347243 discloses an in-vehicle camera in which a circuit board carrying electronic parts, such as a sensor and an image processing circuit, is accommodated in a housing of the in-vehicle camera. If adequate EMI measures are not taken and high voltage due to electrostatic discharge is applied, it may result in malfunction of the in-vehicle camera or destruction of an electronic part. The in-vehicle camera is concerned with the safety performance in vehicle operation, and malfunction of the in-vehicle camera or destruction of the electronic part may significantly affect a human life. Hence, it is required to take adequate EMI measures for the in-vehicle camera.

In the in-vehicle camera according to the related art, a housing made of an insulator, such as a plastic material, is used as the housing of the in-vehicle camera in order to prevent electrostatic discharge from affecting the camera.

Moreover, in the in-vehicle camera according to the related art, when a radiation source of electromagnetic waves exists inside the vehicle, a metal shield plate directly connected to a ground line (GND) of the circuit board is arranged within the housing. As a countermeasure for a case in which electrostatic discharge takes place between a clearance in the insulator and the metal shield plate or the circuit board, the ground line (GND) of the circuit board is connected to a ground line of an external power supply through the cable. This is a known technique.

Japanese Patent No. 3802742 discloses a connector which is used as an in-vehicle component other than an in-vehicle camera. This connector is arranged so that a metal exterior of the connector is enclosed with a metal part connected to a shielding wire of a cable, which causes static electricity to flow through an external ground line to which the cable is connected.

However, the in-vehicle camera according to the related art in which the circuit board is enclosed with the housing of the insulator is directed to preventing occurrence of electrostatic discharge or reducing the occurrence probability of malfunction of the camera or destruction of the electronic part. If no metal shield plate is internally arranged and electrostatic discharge occurs, the portion of the circuit board where the discharge takes place is not predicted. Hence, taking countermeasures or corrective actions requires much time.

Even if a metal shield plate is internally arranged, inside the circuit board, static electricity discharged to the metal shield plate is supplied to the external ground line through the circuit board because the ground line (GND) of the circuit board and the metal shield plate are connected directly at a specific portion. In this case, a high voltage due to the electrostatic discharge is applied to the circuit board instantaneously, and the electronic parts in the circuit board are loaded with this high voltage. Therefore, it is difficult to certainly avoid destruction of the electronic parts due to electrostatic discharge.

Although enclosing the circuit board with the housing of the insulator makes occurrence of electrostatic discharge difficult, once electric discharge occurs, the instantaneous application of a high voltage to the circuit board is unavoidable regardless of the use of a metal shield plate.

A conceivable method for eliminating the problem is to arrange electronic parts which are vulnerable to a high voltage in the areas of the circuit board where the influences of electrostatic discharge are small. However, modification of the circuit board design is not easy to carry out, and it is expected that taking countermeasures or corrective actions requires much time and high cost.

In the connector disclosed in Japanese Patent No. 3802742, the metal exterior and the external ground line are electrically connected. This connector provides a high resistance to electrostatic discharge. However, if this connector is used in an in-vehicle camera, electrical connection between the metal part and the source of electromagnetic waves or the ground line (GND) of the circuit board is not provided, and it is difficult to provide adequate EMI measures.

SUMMARY OF THE INVENTION

In one aspect, the present disclosure provides a camera unit which is capable of providing high resistance to electrostatic discharge and good shielding performance of electromagnetic waves with low cost.

In another aspect, the present disclosure provides a sensing device which is capable of providing good reliability with low cost.

In an embodiment which solves or reduces one or more of the above-described problems, the present disclosure provides a camera unit including: an image sensor; a circuit board in which a signal processor circuit to process an output signal of the image sensor is formed; a cable including at least a signal conductor element and a ground conductor element and connected at one end to the circuit board; and a shielding component formed to enclose the circuit board therewith, wherein the ground conductor element is connected to both a ground terminal of the circuit board and the shielding component in a vicinity of the end of the cable where the cable is connected to the circuit board.

In an embodiment which solves or reduces one or more of the above-described problems, the present disclosure provides a sensing device including: a camera unit to capture an image indicating surroundings of the camera unit; and a display unit to display image information based on an output signal of the camera unit, the camera unit including: an image sensor; a circuit board in which a signal processor circuit to process an output signal of the image sensor is formed; a cable including at least a signal conductor element and a ground conductor element and connected at one end to the circuit board; and a shielding component formed to enclose the circuit board therewith, wherein the ground conductor element is connected to both a ground terminal of the circuit board and the shielding component in a vicinity of the end of the cable where the cable is connected to the circuit board.

Other objects, features and advantages of the present invention will become more apparent from the following detailed description when read in conjunction with the accompanying drawings.

DETAILED DESCRIPTION OF THE PREFERRED EMBODIMENTS

A description will be given of embodiments of the present disclosure with reference to the accompanying drawings.

Figure 1:
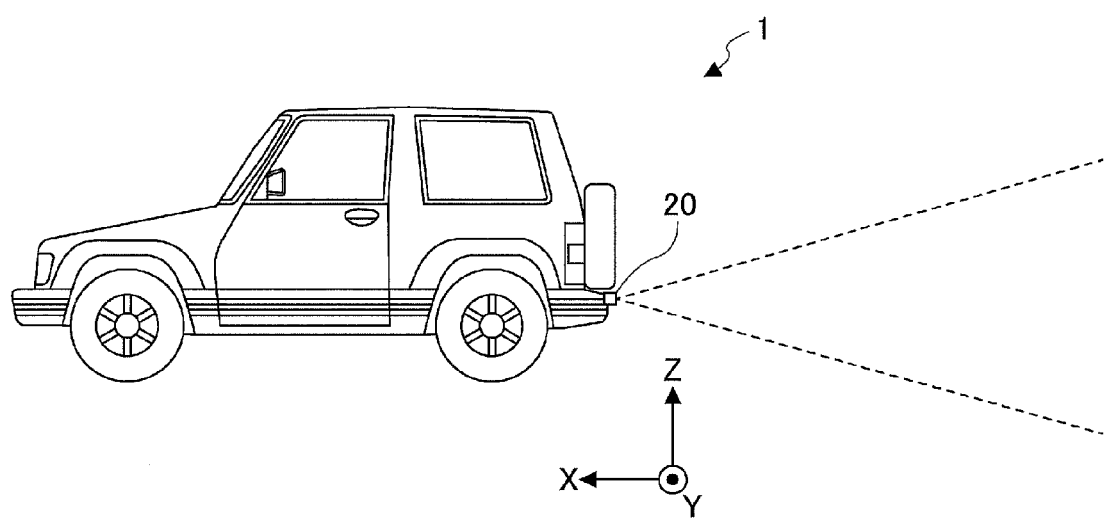
FIG. 1 is a diagram illustrating the composition of a vehicle in which an in-vehicle camera is arranged.

FIG. 1 illustrates the composition of a vehicle 1 in which an in-vehicle camera 20 is arranged.

For the purpose of assisting a driver's vision, an in-vehicle camera is installed at a rear portion, a front portion or a side portion of a vehicle, so that an image indicating the surroundings of the vehicle captured by the camera is displayed on a display unit, such as a liquid crystal display monitor, in the vehicle. In order to provide a safe system without a dead angle, it is required that the in-vehicle camera has a large viewing angle. In view of a vehicle design, it is desired that the in-vehicle camera is not conspicuous. Hence, it is also required that the in-vehicle camera is of small size.

A back-monitor type camera which is a popular in-vehicle camera is externally attached to the vehicle, and it is required that the camera has a high waterproofing performance. Usually, an in-vehicle camera is installed in the vicinity of the trunk at the rear of the vehicle and a display unit is installed on the side of a driver's seat, and it is necessary that a cable needed for the wiring that connects the camera and the display unit is almost about 10 m long.

It is also required that the in-vehicle camera has a tensile strength that can withstand the wiring, provides a function of preventing malfunction of the camera due to electromagnetic waves emitted from several sources of electromagnetic waves, and provides a function of preventing the adverse influences of electromagnetic waves emitted from the in-vehicle camera on an in-vehicle radio unit, such as an FM radio or an AM radio. It is also required that the in-vehicle camera has a high resistance to electrostatic discharge which may frequently occur in the winter season.

In the vehicle 1 illustrated in FIG. 1, the in-vehicle camera 20 is externally attached to a rear portion of the vehicle 1. In the following, it is assumed that a forward direction of the vehicle 1 is the +X direction of the X-axis of an XYZ three-dimensional orthogonal coordinate system, a lateral direction of the vehicle 1 is the +Y or −Y direction of the Y-axis thereof, and a gravity direction is the −Z direction of the Z-axis thereof.

Figure 2:
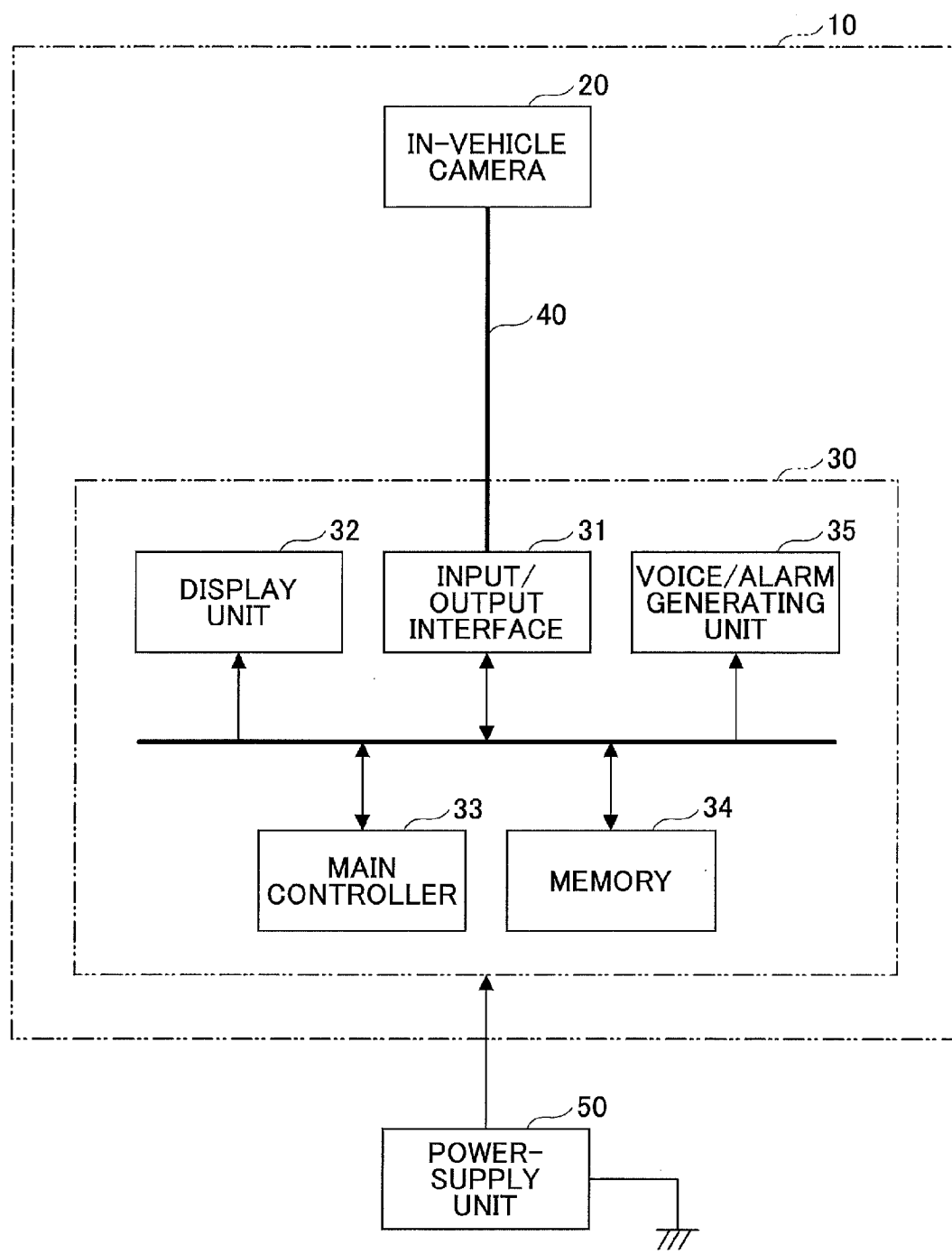
FIG. 2 is a block diagram illustrating the composition of a back monitoring device (sensing device) of an embodiment of the present disclosure.

As illustrated in FIG. 2, an information processing device 30 which processes image information from the in-vehicle camera 20 is disposed inside the vehicle 1. The information processing device 30 and the in-vehicle camera 20 are connected together via a cable 40.

The information processing device 30 includes an input/output interface 31, a display unit 32, a main controller 33, a memory unit 34, and a voice/alarm generating unit 35. Power from a power-supply unit 50 is supplied to the information processing device 30.

In this embodiment, a back monitoring device 10 is constituted by the in-vehicle camera 20, the information processing device 30, and the cable 40.

Figure 3A:
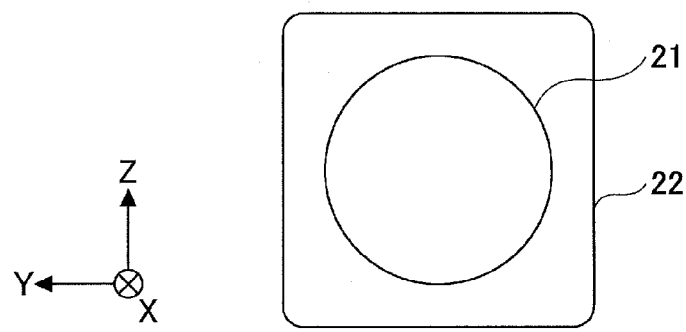
FIG. 3A, FIG. 3B and FIG. 3C are diagrams illustrating the composition of an in-vehicle camera (camera unit) of an embodiment of the present disclosure.
Figure 3B:
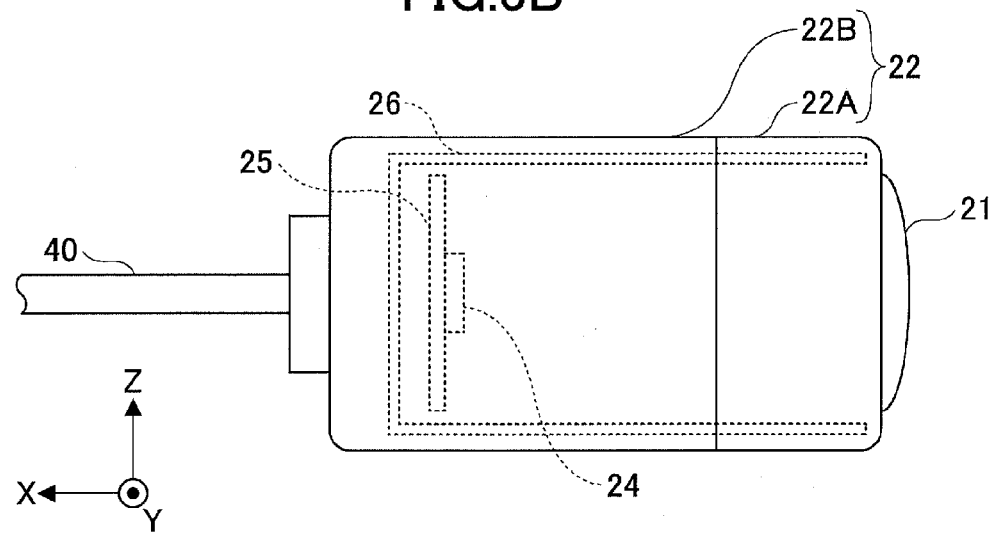
Figure 3C:
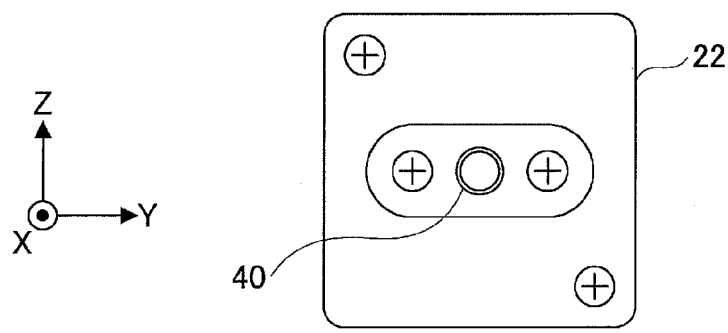

As illustrated in FIGS. 3A to 3C, the in-vehicle camera 20 includes a lens system 21, a camera housing 22, a CMOS (complementary metal oxide semiconductor) image sensor 24, a circuit board 25, and a shield plate 26. In this embodiment, one end of the cable 40 in the −X direction is connected to the in-vehicle camera 20.

The lens system 21 is designed to have a wide angle of view which is in a range of 120 to 190 degrees in order to enable an image, indicating the surroundings of the vehicle 1 at the rear thereof including the right and left sides thereof, to be captured by the camera. For example, the lens system 21 is made up of six lenses in order to capture a quality image.

The camera housing 22 is formed of a resin molding and has a square pole-like configuration. A holding part for holding the lens system 21 is formed at one end of the camera housing 22 in the −X direction, and an opening for inserting the cable 40 is formed in the camera housing 22 in the middle of the end face thereof at the other end of the camera housing 22 in the +X direction. Two threaded holes for fastening the cable 40 to the camera housing 22 by screws are formed in the camera housing 22 at right and left portions of this opening in the +Y and −Y directions.

The camera housing 22 may be divided into two parts: a front case 22A on the side of the camera housing 22 in the −X direction and a rear case 22B on the side thereof in the +X direction. The front case 22A and the rear case 22B are fitted together into an integral part.

An O-ring is attached to a clearance between the camera housing 22 and the lens system 21 in order to prevent water or foreign matter from entering the inside of the camera housing 22 from the clearance. A rubber packing is attached to the fitted portion of the front case 22A and the rear case 22B in order to prevent water or foreign matter from entering the interior of the camera housing 22 from the fitted portion.

The CMOS image sensor 24, the circuit board 25, and the shield plate 26 are accommodated in the camera housing 22.

The CMOS image sensor 24 converts the incident light entering the sensor through the lens system 21 into an electrical signal. The CMOS image sensor 24 is attached to the circuit board 25 through a ceramic package.

The shield plate 26 is a sheet-like shielding component which is made of stainless steel, phosphor bronze, etc. and has a thickness of about 0.2 mm. The shield plate 26 is formed to enclose the circuit board 25 therewith. An opening which is essentially the same as the opening of the camera housing 22 is formed in the portion of the shield plate 26 which faces the opening of the camera housing 22. The shield plate 26 has a function of shielding electromagnetic waves and a function of receiving electrostatic discharge. The shield plate 26 is attached to a predetermined position of the rear case 22B.

Figure 4:
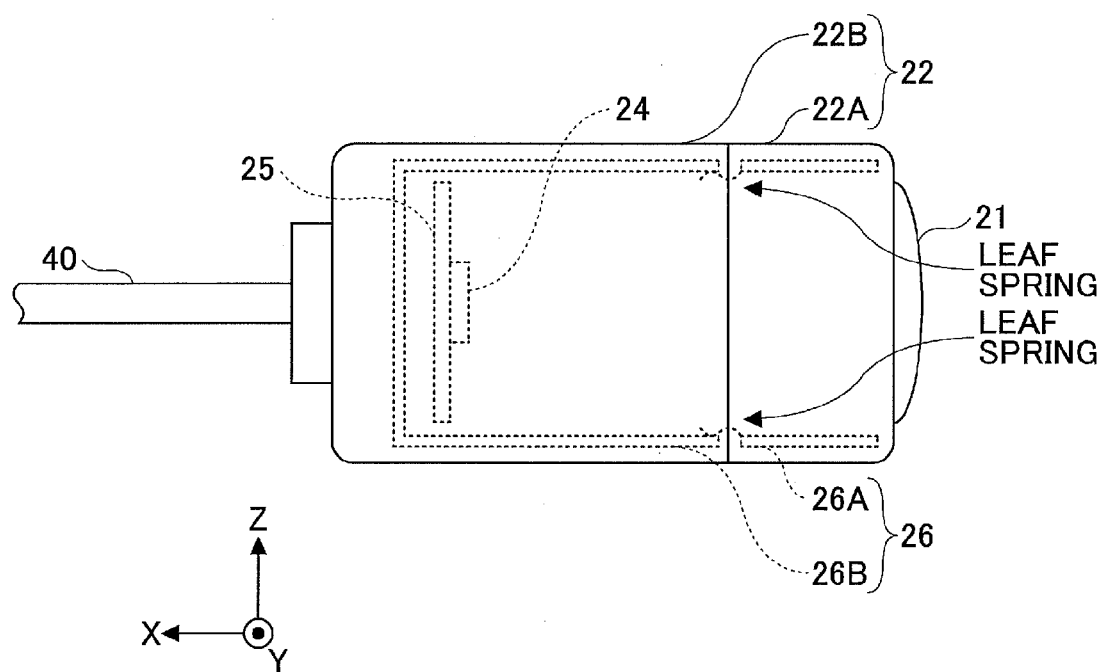
FIG. 4 is a diagram illustrating a modification of a shield plate.

Alternatively, the shield plate 26 may be modified as illustrated in FIG. 4. In this modification, the shield plate 26 may be divided into two pieces: a shield plate 26A disposed in the front case 22A and a shield plate 26B disposed in the rear case 22B. It is necessary that, when the front case 22A and the rear case 22B are fitted together, the two shield plates 26A and 26B are in contact with each other through leaf springs (made of a metallic material), so that the shield plates 26A and 26B are electrically connected to each other.

In the circuit board 25, a signal processor circuit, an internal power supply, etc. are formed. The circuit board 25 is attached to a predetermined position of the rear case 22B.

The signal processor circuit inputs an output signal of the CMOS image sensor 24, processes the input signal by correcting the distortion and brightness of an image indicated by the input signal, and outputs the processed signal as an analog video (NTSC) signal.

Figure 5:
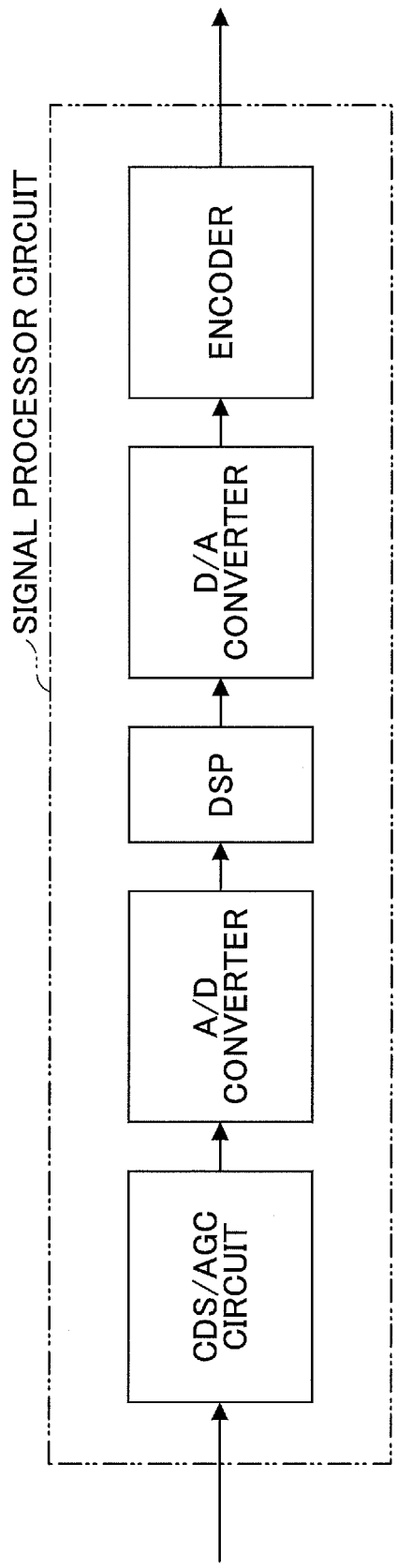
FIG. 5 is a block diagram illustrating the composition of a signal processor circuit.

As illustrated in FIG. 5, the signal processor circuit includes a CDS/AGC circuit, an A/D converter, a DSP (digital signal processor), a D/A converter, and an encoder.

The CDS/AGC circuit includes a CDS (correlated double sampling) circuit and an AGC (automatic gain control) circuit. The CDS circuit provides a function of measuring electrical values of output signals of the CMOS image sensor 24, such as voltages or currents, to allow for removal of an undesired offset or reset noise contained in the output signals of the CMOS image sensor 24. The AGC circuit provides an automatic gain control for sensor output signals in that the black level of the image signal is held at a constant level.

The A/D converter converts the analog signal output from the CDS/AGC circuit into a digital signal. The DSP performs a predetermined compensation processing for the digital signal output from the A/D converter. The D/A converter converts the digital signal output from the DSP into an analog signal. The encoder converts the analog signal output from the D/A converter into an analog video signal. The signal processor circuit outputs this analog video signal as an output signal.

The internal power supply in the circuit board 25 supplies power from the cable 40 to the respective electronic parts fabricated in the CMOS image sensor 24 and the circuit board 25.

Figure 6:
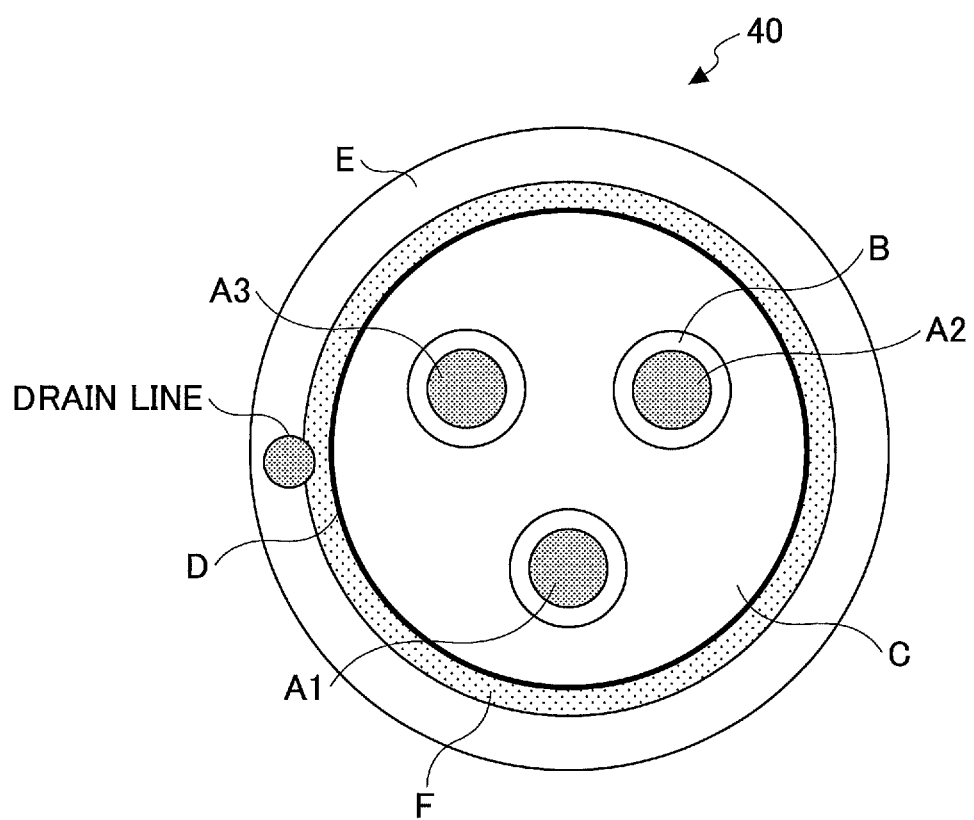
FIG. 6 is a diagram illustrating the composition of a cable.

FIG. 6 illustrates the composition of a cable 40. As illustrated in FIG. 6, the cable 40 includes an analog signal line A1, a power supply line A2, a ground line A3, and a shield material F as conductor elements.

The analog signal line A1 is a conductor element for transmitting an image signal from the in-vehicle camera 20 to the information processing device 30. The power supply line A2 is a conductor element for supplying power from the power supply unit 50 to the in-vehicle camera 20 through the information processing device 30.

Each of the analog signal line A1, the power supply line A2, and the ground line A3 is enclosed with an insulator B, respectively. Each line is formed into an insulated wire.

Using a bundling material D, the three insulated wires with an inclusion material C are bundled together to have a generally circular cross section. The bundling material D is enclosed with the shield material F, and further the shield material F is enclosed with an insulating material E as a sheath.

An example of the inclusion material C may be cotton yarn or a soft resin. An example of the bundling material D may be paper or a tape. An example of the shield material F may be a braided or woven shield of fine wires, or an aluminum tape. When an aluminum tape is used as the shield material F, at least one conductor line as a drain line is contacted to the surface of the aluminum tape as illustrated in FIG. 6. This enables the work of connection processing at the end portion of the cable to be easily performed. The shield material F may be used as a ground conductor element for taking preventive measures against electromagnetic waves and electrostatic discharge.

An example of the insulating material E may be nylon resin, polyethylene resin, or urethane resin.

Figure 7:
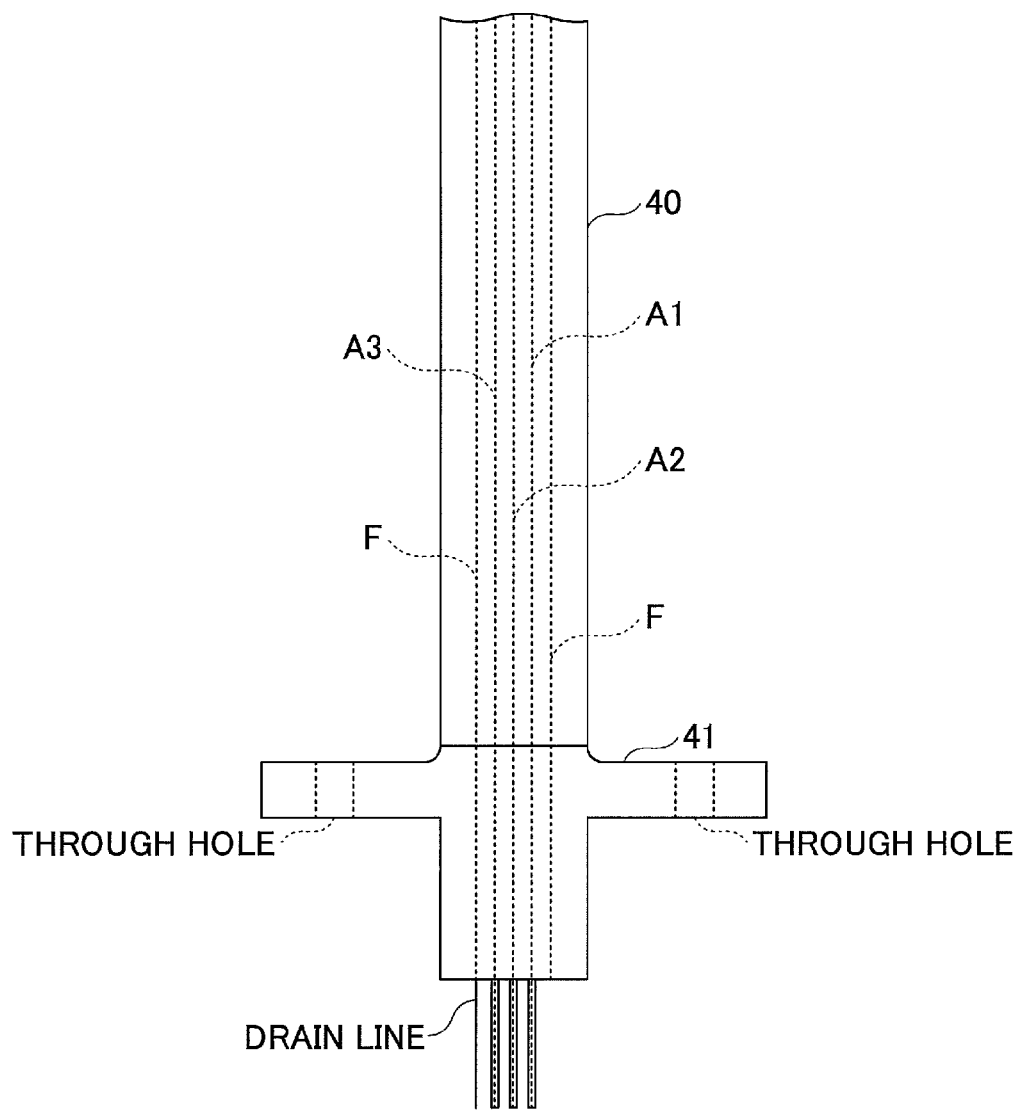
FIG. 7 is a diagram illustrating the composition of an end portion of a cable which is connected to the in-vehicle camera.
Figure 7:
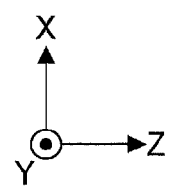

As illustrated in FIG. 7, the three insulated wires and the drain line are exposed at the end of the cable 40 in the −X direction.

A block 41 which is made of a resin molding and includes two through holes is bonded to a portion of the cable 40 in the vicinity of the end of the cable 40 in the −X direction. In this embodiment, a resin having good adherability to the insulating material E is used as the resin material of the block 41. This helps prevent separation of the cable 40 from the block 41 when the cable 40 is under tension.

Alternatively, a crimping ring may be fitted to the outer periphery of the insulating material E and the crimping ring may be formed of a resin molding using a resin that is the same as the resin of the block 41. This helps prevent the sliding of the cable 40.

Figure 8:
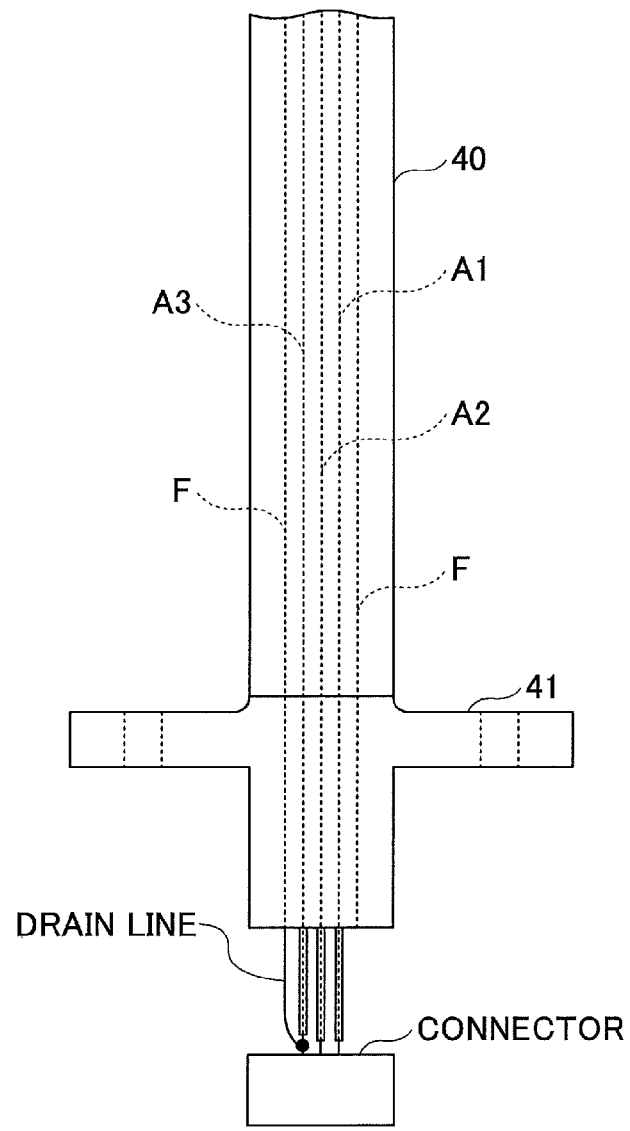
FIG. 8 is a diagram illustrating the composition of an end portion of a cable which is connected to the in-vehicle camera.

As illustrated in FIG. 8, a portion of the insulator B of each of the three insulated wires (which are exposed from the cable 40) in the vicinity of the end of the cable 40 in the −X direction is removed. These insulated wires are inserted in a connector. The ground line A3 and the drain line are bonded together in the vicinity of the connector by soldering.

Next, a process of connecting the cable 40 and the in-vehicle camera 20 will be described. It is assumed that the camera housing 22 is initially divided into the front case 22A and the rear case 22B, and the circuit board 25 is not yet attached to the rear case 22B.

Figure 9:
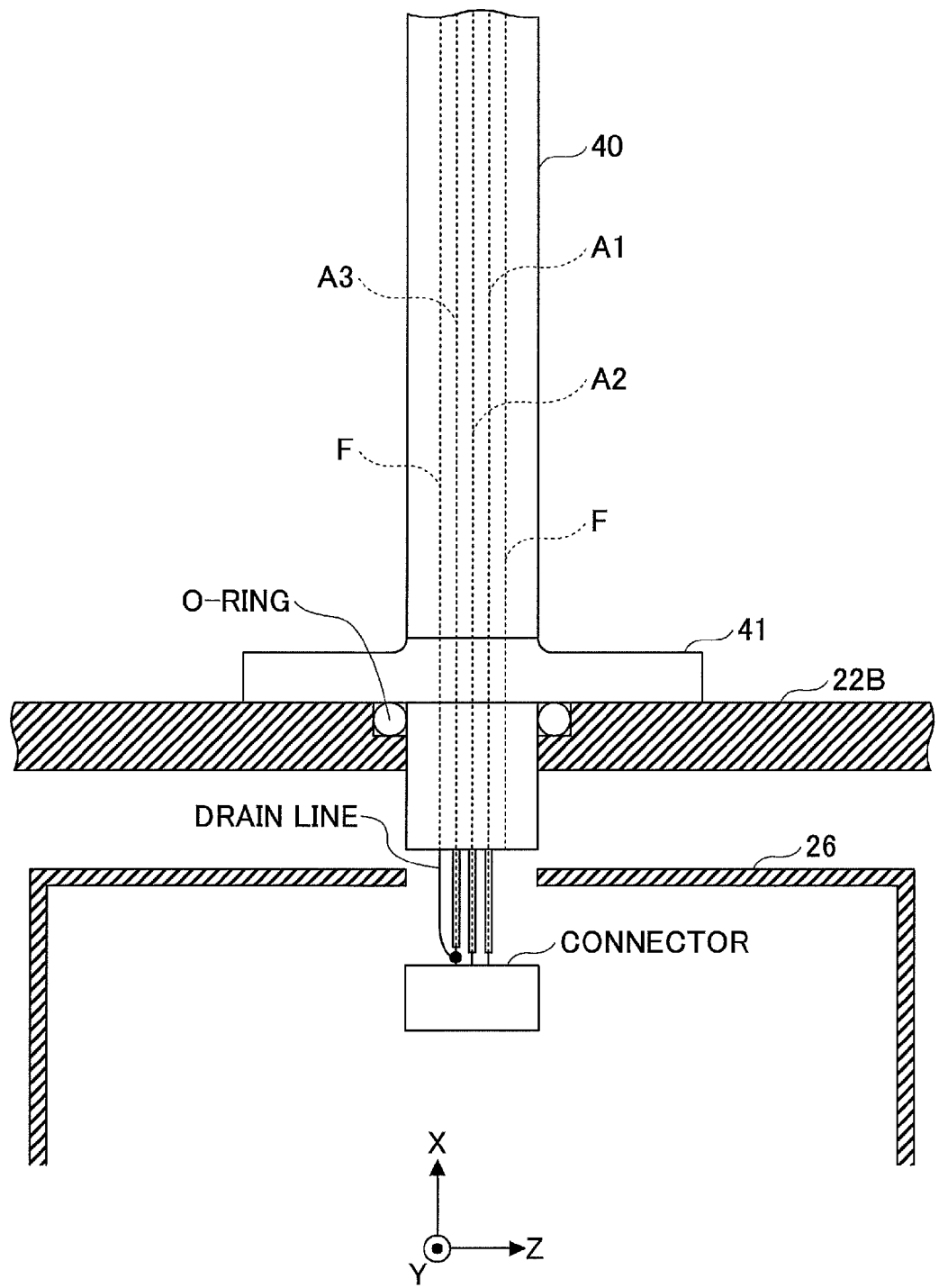
FIG. 9 is a diagram for explaining a process of connecting the cable to the in-vehicle camera.

(1) As illustrated in FIG. 9, the end of the cable 40 in the −X direction is inserted into the camera housing 22 through the opening at the end of the camera housing 22 in the +X direction and the opening of the shield plate 26, and the block 41 is brought into contact with the rear case 22B. At this time, an O-ring is attached to a recess between the block 41 and the rear case 22B.

Figure 10:
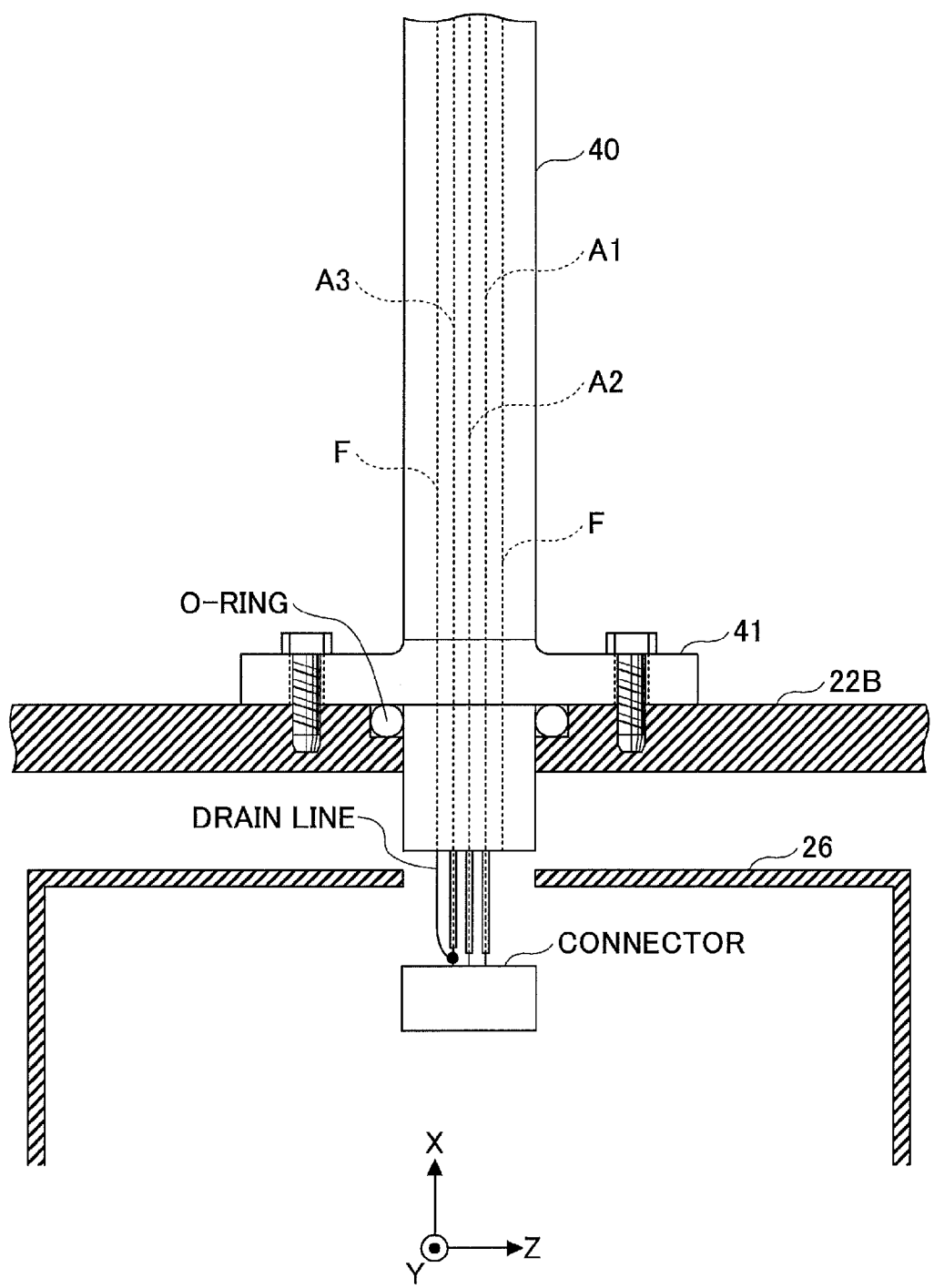
FIG. 10 is a diagram for explaining a process of connecting the cable to the in-vehicle camera.

(2) As illustrated in FIG. 10, screws are respectively inserted in the through holes of the block 41 and fastened to the threaded holes formed in the rear case 22B. Thereby, the block 41 is fixed to the rear case 22B by the screws. The use of the O-ring fitted between the block 41 and the rear case 22B helps prevent water or foreign matter from entering the camera housing 22 from the clearance between the block 41 and the rear case 22B.

Figure 11:
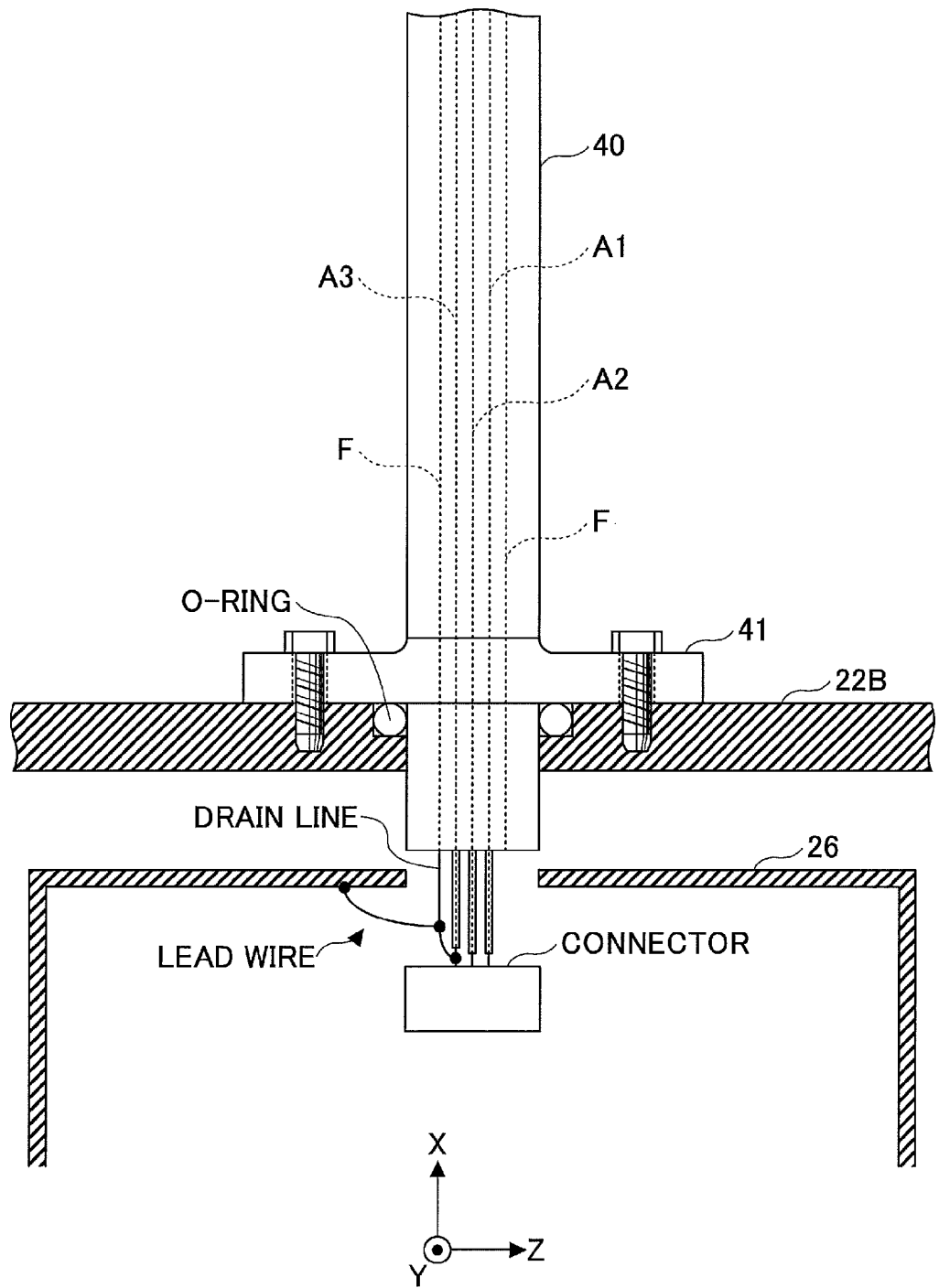
FIG. 11 is a diagram for explaining a process of connecting the cable to the in-vehicle camera.

(3) As illustrated in FIG. 11, the drain line and the shield plate 26 are connected together by a lead wire. Thereby, the shield plate 26 is electrically connected to both the ground line A3 and the drain line.

Figure 12:
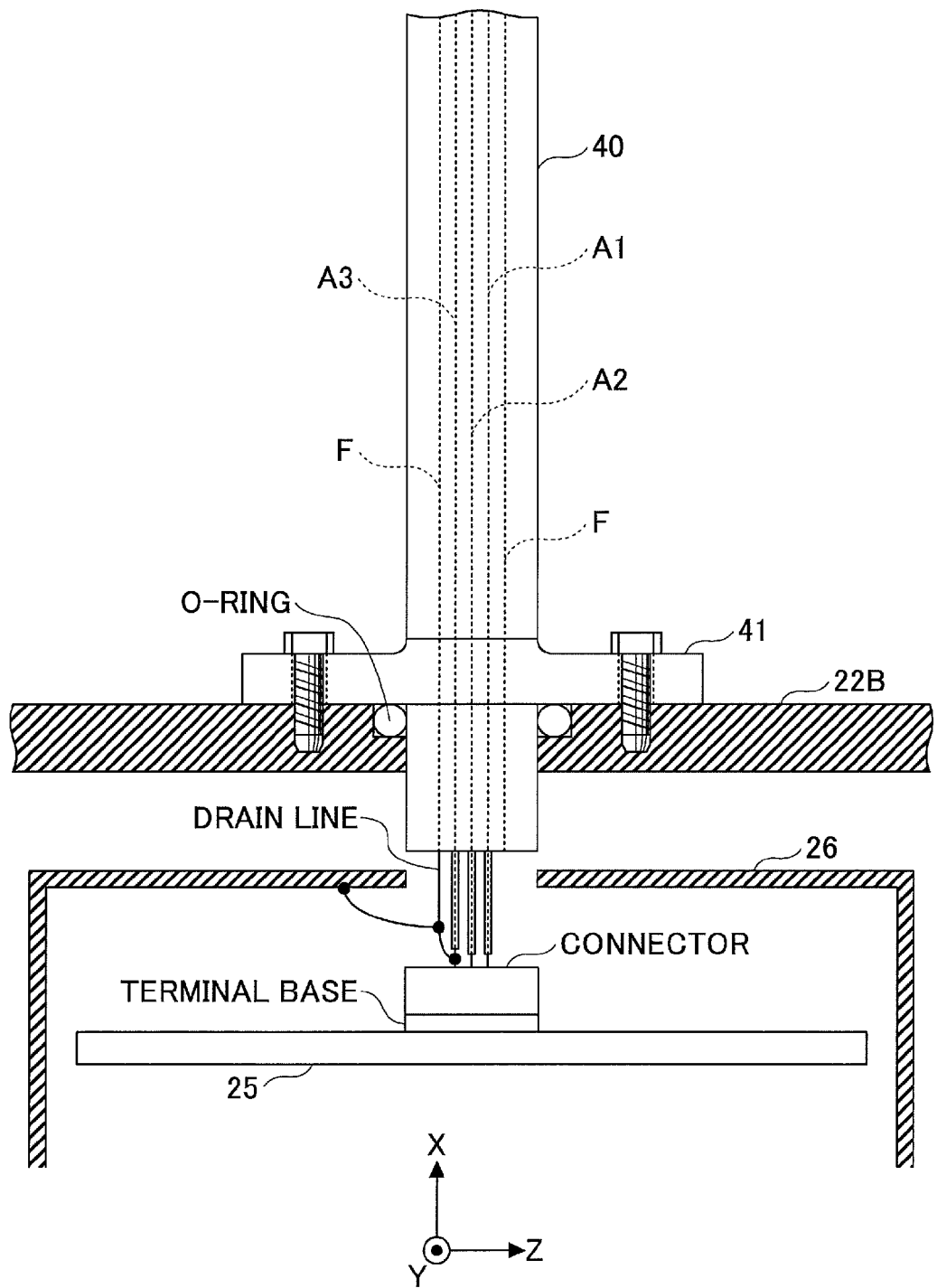
FIG. 12 is a diagram for explaining a process of connecting the cable to the in-vehicle camera.

(4) As illustrated in FIG. 12, the connector of the cable 40 is connected to a terminal base provided in the circuit board 25, and the circuit board 25 is attached to the predetermined position of the rear case 22B.

(5) The front case 22A is fitted to the rear case 22B.

On the other hand, a connector, such as an RCA jack, a DC plug or a bullet terminal, is attached to the other end of the cable 40 in the +X direction. The cable 40 is connected to the input/output interface 31 of the information processing device 30 through this connector. The shield material F of the cable 40 is connected to a ground line of the power-supply unit 50.

Figure 13:
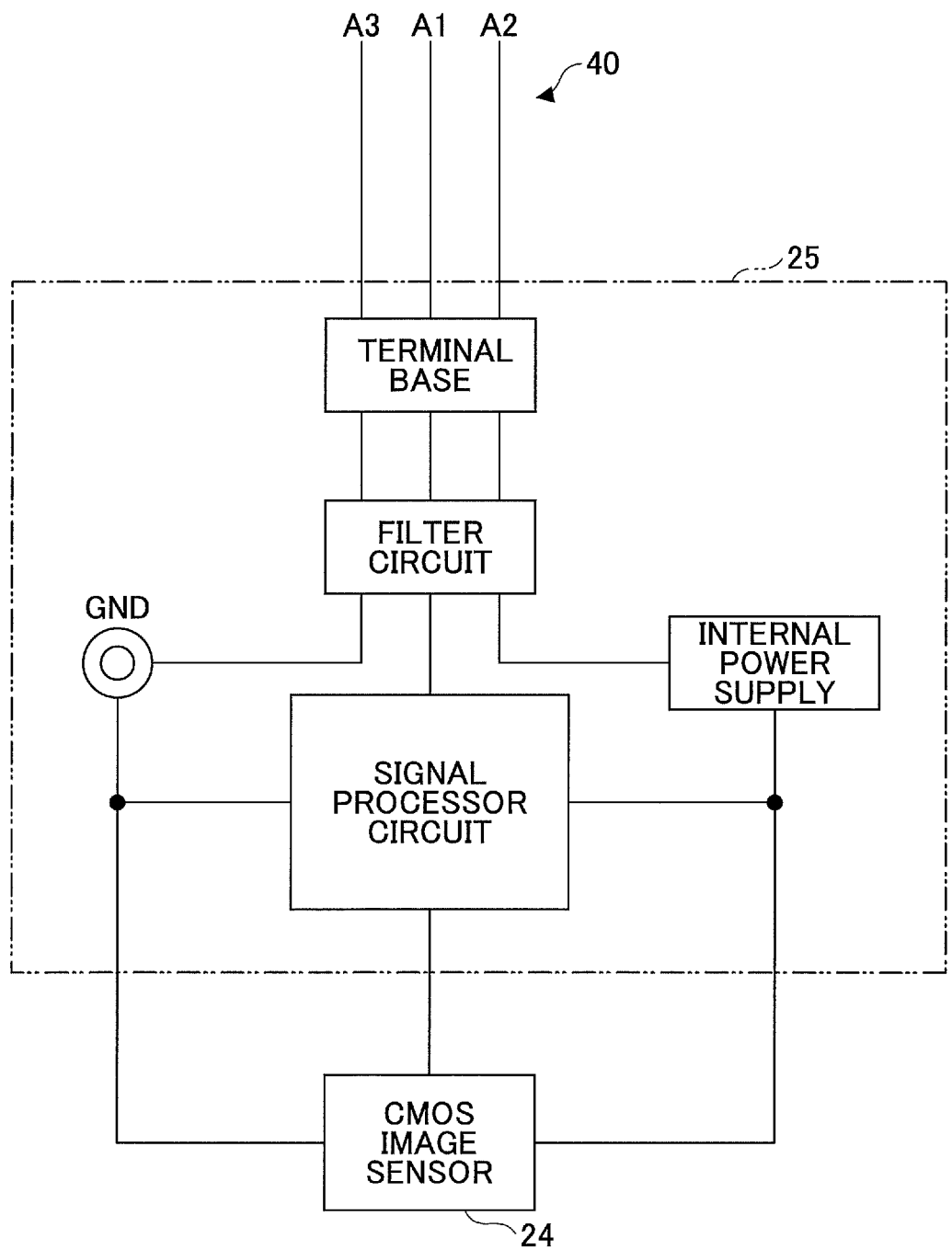
FIG. 13 is a block diagram illustrating the composition of a filter circuit in a circuit board.

Generally, noise is mixed in a signal transmitted through a power supply line and a ground line from an external device. As illustrated in FIG. 13, a filter circuit is arranged in the circuit board 25 to remove noise from the signal received from the external device. The ground line A3 of the cable 40 is connected to a ground terminal (GND) of the circuit board 25 through the filter circuit. The power supply line A2 of the cable 40 is connected to an internal power supply through the filter circuit.

Figure 14:
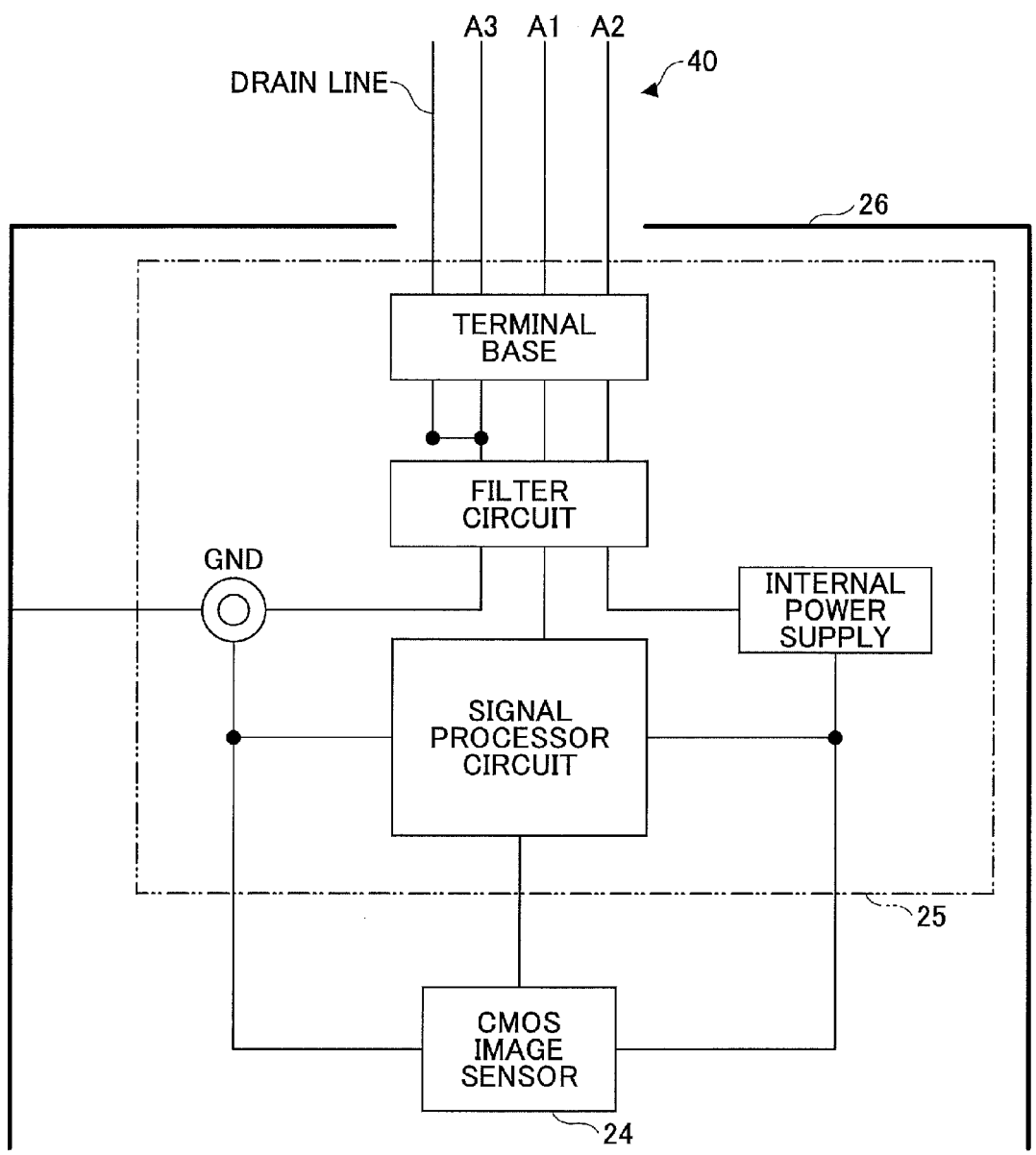
FIG. 14 is a diagram for explaining a method of connecting a shield plate to a ground line in an in-vehicle camera according to the related art.

FIG. 14 is a diagram for explaining a method of connecting a shield plate to a ground line in an in-vehicle camera according to the related art. In the method according to the related art, as illustrated in FIG. 14, a ground line A3 and a drain line are connected to a terminal base of a circuit board 25 individually, connected to the surface of the circuit board 25, and then connected to the filter circuit. A shield plate 26 is connected to a ground terminal (GND) of the circuit board 25. In this case, if the connector of the cable 40 is connected to the circuit board 25, the shield plate 26, the ground terminal of the circuit board 25, and the ground line A3 and the drain line of the cable 40 are electrically connected together. However, in this case, electrostatic discharge occurring in the shield plate 26 will certainly pass through the circuit board 25.

Figure 15:
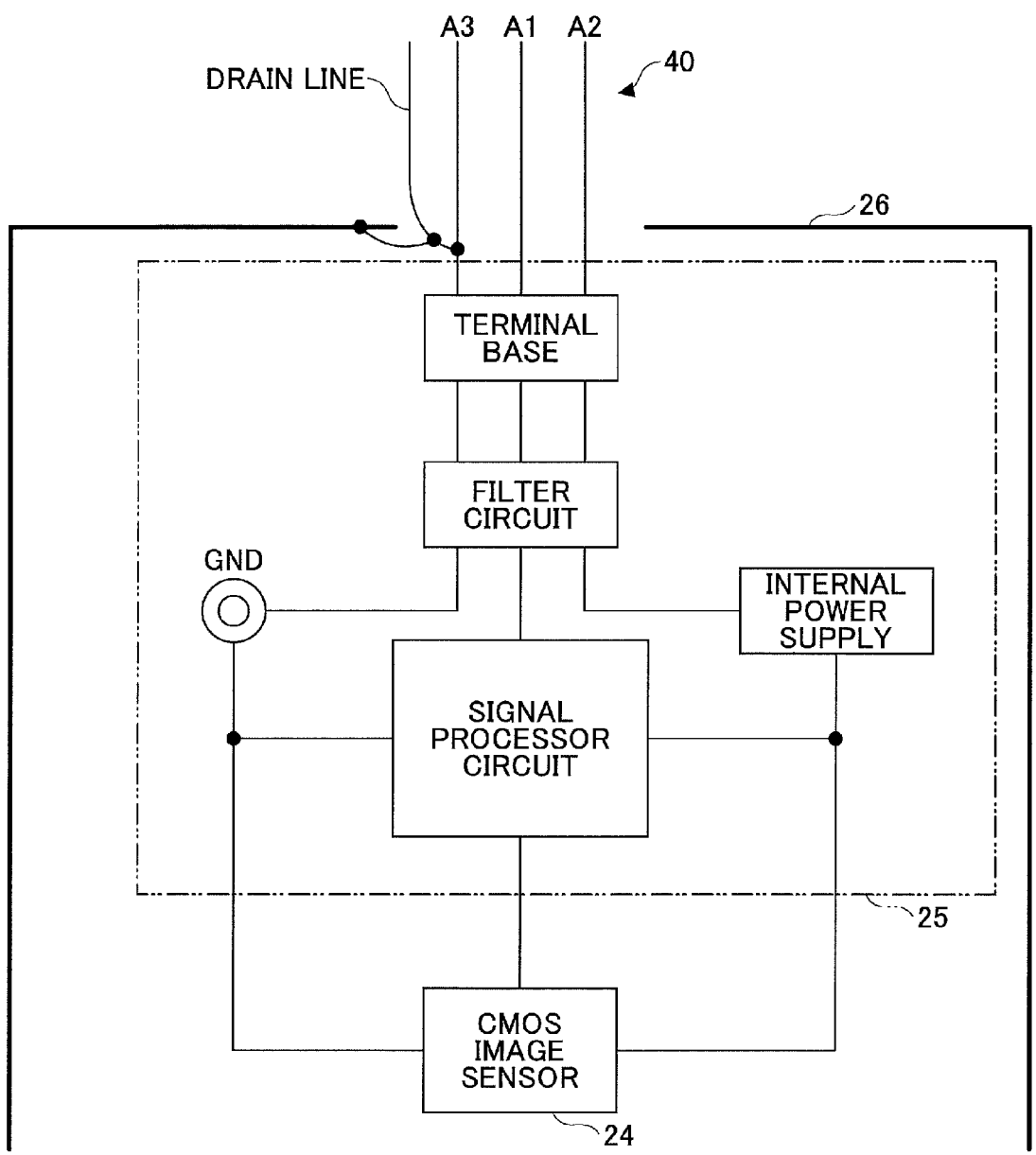
FIG. 15 is a diagram for explaining a method of connecting a shield plate to a ground line in the in-vehicle camera of this embodiment.

To eliminate the problem, in this embodiment, as illustrated in FIG. 15, the ground line A3, the drain line, and the shield plate 26 are electrically connected to each other in the vicinity of the end of the cable 40. The ground line A3 is electrically connected to the ground terminal (GND) of the circuit board 25 through the filter circuit. In this case, if electrostatic discharge occurs in the shield plate 26, the impedance of the conduction line passing along the shield plate 26 and the drain line is lower than the impedance of the conduction line passing along the shield plate 26, the ground line A3, the filter circuit, and the ground terminal (GND) of the circuit board 25. For this reason, the electrostatic discharge occurring in the shield plate 26 does not pass through the circuit board 25.

In order to provide adequate shielding characteristics of the shield plate 26 against electromagnetic waves emitted from the circuit board 25, a filtering constant of the filter circuit may be adjusted. Moreover, the circuit board 25 is enclosed in the shield plate 26 connected to the ground line, and it is possible to provide adequate shielding performance.

Figure 16:
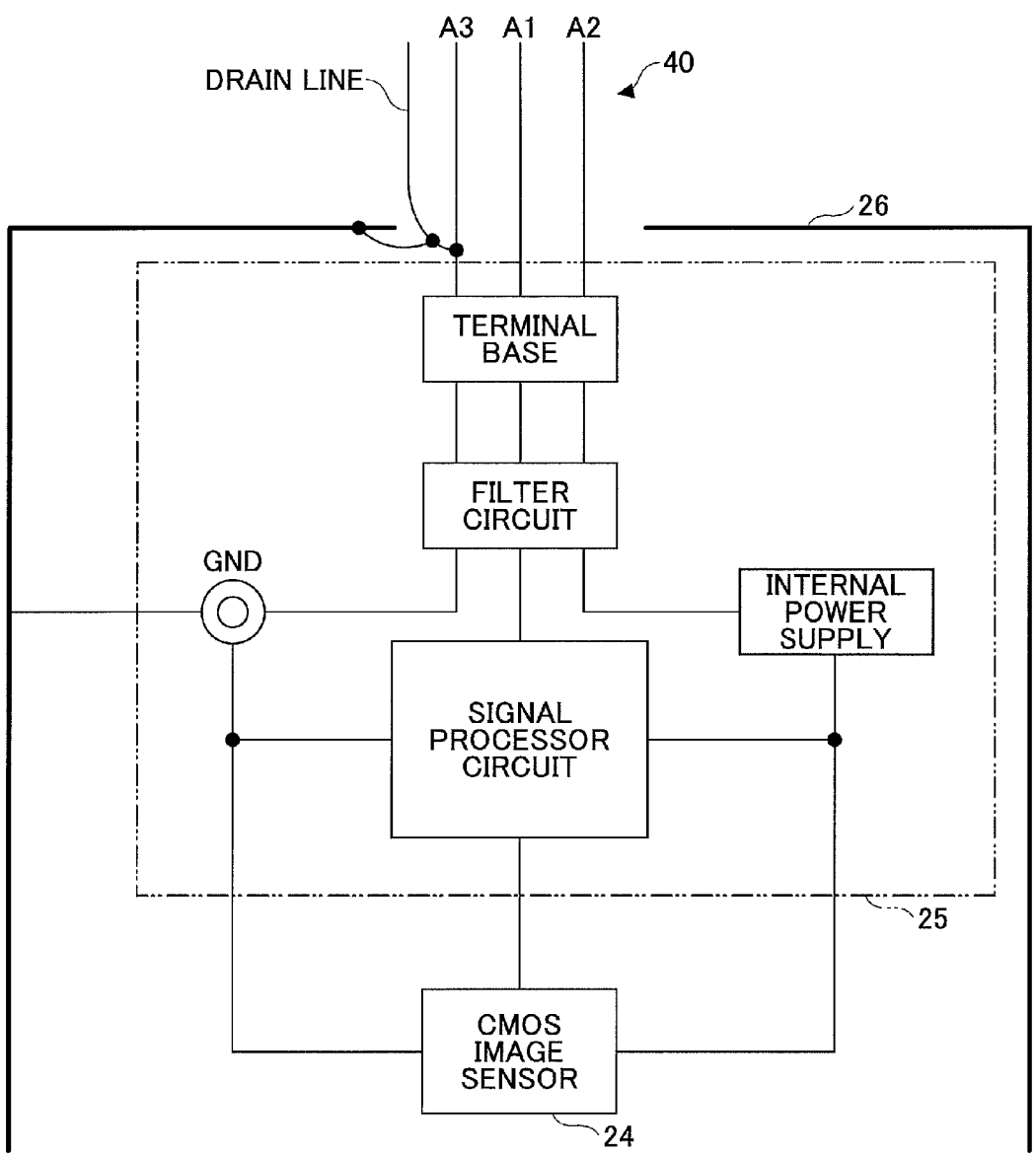
FIG. 16 is a diagram for explaining a method of connecting a shield plate to a ground line in the in-vehicle camera of this embodiment.

FIG. 16 is a diagram for explaining another method of connecting the shield plate to the ground line in the in-vehicle camera of this embodiment. As illustrated in FIG. 16, the shield plate 26 may be further connected to the ground terminal (GND) of the circuit board 25. In this case, it is possible to provide an increased shielding characteristic of the shield plate 26 against electromagnetic waves emitted from the circuit board 25.

As described in the foregoing, the ground line A3 and the shield plate 26 are electrically connected to each other with low impedance at the end of the cable 40 on the side of the in-vehicle camera 20, and the ground line A3 is connected to the ground terminal of the circuit board 25 through the filter circuit. This connecting procedure can be easily performed when attaching the cable 40 to the in-vehicle camera 20.

Referring back to FIG. 2, in the back monitoring device of this embodiment, the main controller 33 of the information processing device 30 controls operation of the whole back monitoring device 10. The main controller 33 determines whether there is a danger, based on an output signal of the in-vehicle camera 20. For example, when a person, another vehicle, a bicycle, or an obstacle exists at the rear of the vehicle 1 and a collision or a rear-end collision is likely to occur, the main controller 33 determines that there is a danger, and outputs alarm information to both the display unit 32 and the voice/alarm generating unit 35.

The display unit 32 is disposed in the vicinity of the driver's seat of the vehicle 1 so that a driver can easily see a screen of the display unit 32. A display image indicated by the analog video signal received from the in-vehicle camera 20 through the analog signal line A1 of the cable 40 is displayed on the screen of the display unit 32. If alarm information is received from the main controller 33, the display unit 32 displays a corresponding alarm message.

Figure 17:
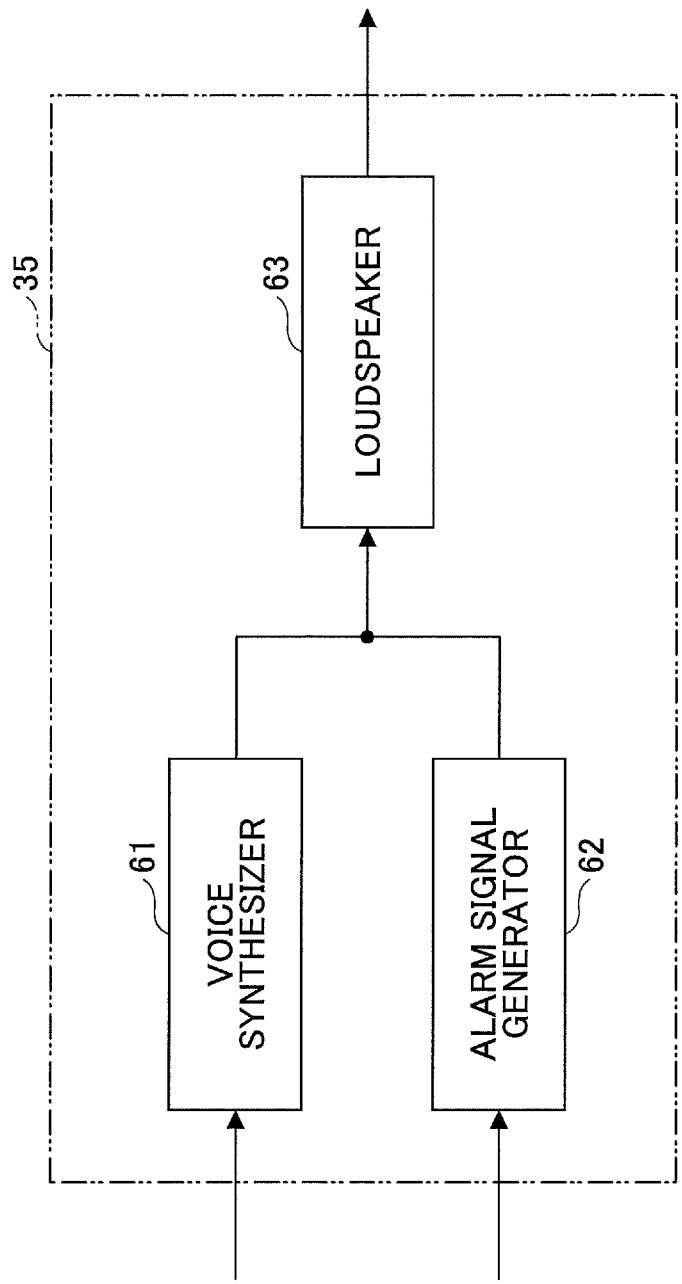
FIG. 17 is a block diagram illustrating the composition of a voice/alarm generating unit.

As illustrated in FIG. 17, the voice/alarm generating unit 35 includes a voice synthesizer 61, an alarm signal generator 62, and a loudspeaker 63. The voice synthesizer 61 stores a plurality of voice data items. If alarm information is received from the main controller 33, the voice synthesizer 61 selects a corresponding one of the voice data items with respect to the received alarm information and outputs the selected data item to the loudspeaker 63.

If alarm information is received from the main controller 33, the alarm signal generator 62 generates a corresponding alarm signal with respect to the received alarm information and outputs the generated alarm signal to the loudspeaker 63.

If it is determined that there is a danger, the main controller 33 stores the output signal of the in-vehicle camera 20 into the memory unit 34.

As is apparent from the foregoing, the sensing device according to the present disclosure is constituted by the back monitoring device 10 of this embodiment. The camera unit according to the present disclosure is constituted by the in-vehicle camera 20 and the cable 40 in this embodiment. A monitoring control device by the present disclosure is constituted by the main controller 33 and the voice/alarm generating unit 35 in this embodiment.

As described above, in the back monitoring device 10 of this embodiment, the shield plate 26 with which the circuit board 25 of the in-vehicle camera 20 is enclosed is connected to the ground line A3 and the drain line in the vicinity of the end of the cable 40. According to the back monitoring device 10 of this embodiment, an electrostatic discharge occurring in the shield plate 26 can be transferred to the ground line of the power-supply unit 50 through the drain line, without passing through the circuit board 25. It is thus possible to eliminate the problem of destruction of the electronic parts due to electrostatic discharge. It is also possible to provide an increased resistance to static electricity for the in-vehicle camera 20.

Because the circuit board 25 of the in-vehicle camera 20 is enclosed with the shield plate 26 which is set to the ground potential, it is possible to provide adequate EMI measures against electromagnetic waves. Accordingly, it is possible to provide the in-vehicle camera 20 which is capable of providing a high resistance to electrostatic discharge and good performance of shielding electromagnetic waves with low cost.

Because the block 41 of the resin molding is attached to the portion of the cable 40 in the vicinity of the end of the cable 40 and the block 41 is fixed to the camera housing 22 via the O-ring, it is possible to provide good waterproofing performance of the in-vehicle camera 20. The workability at the time of attaching the cable 40 to the in-vehicle camera 20 can be improved. It is also possible to provide good tensile strength for the cable 40.

The shield plate 26 in the above-described embodiment may be replaced with a conductive material which is painted or vapor-deposited to the internal wall of the camera housing 22. In this case, it is necessary that the conductive material of the front case 22A and the conductive material of the rear case 22B are electrically connected to each other at the time of assembly.

In the above-described embodiment, the camera housing 22 is made of a resin molding. However, the present disclosure is not limited to this embodiment. For example, the camera housing 22 may be made of an aluminum die-cast component. In this case, the camera housing 22 serves as the shield plate 26 and the shield plate 26 may be omitted.

Figure 18:
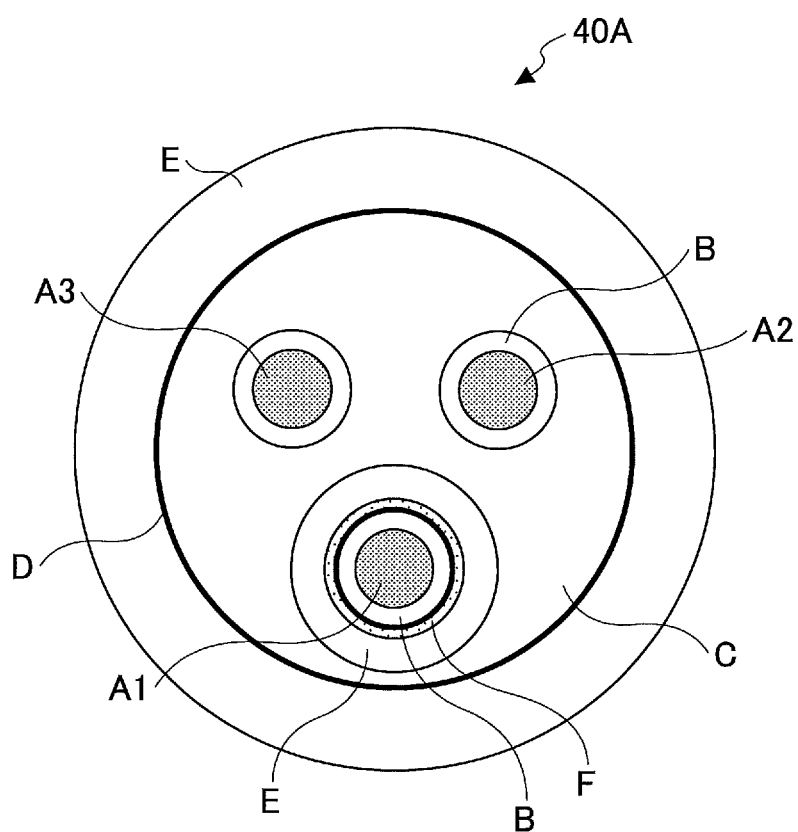
FIG. 18 is a diagram illustrating the composition of a modification of the cable.

Instead of the cable 40 in the above-described embodiment, a cable 40A as illustrated in FIG. 18 may be used. In the cable 40A, the analog signal line A1 is a coaxial line in which the core conductor is enclosed with an insulator B, a shield material F, and an insulator (sheath) E. In this case, control of the impedance between the analog signal line A1 and the shield material F is possible, and degradation of the analog video signal can be prevented by adjusting the impedance to 50 ohms or 75 ohms, etc. In this case, the shield material F of the coaxial line may be used as a ground conductor element for taking preventive measures against electromagnetic waves and electrostatic discharge.

Figure 19:
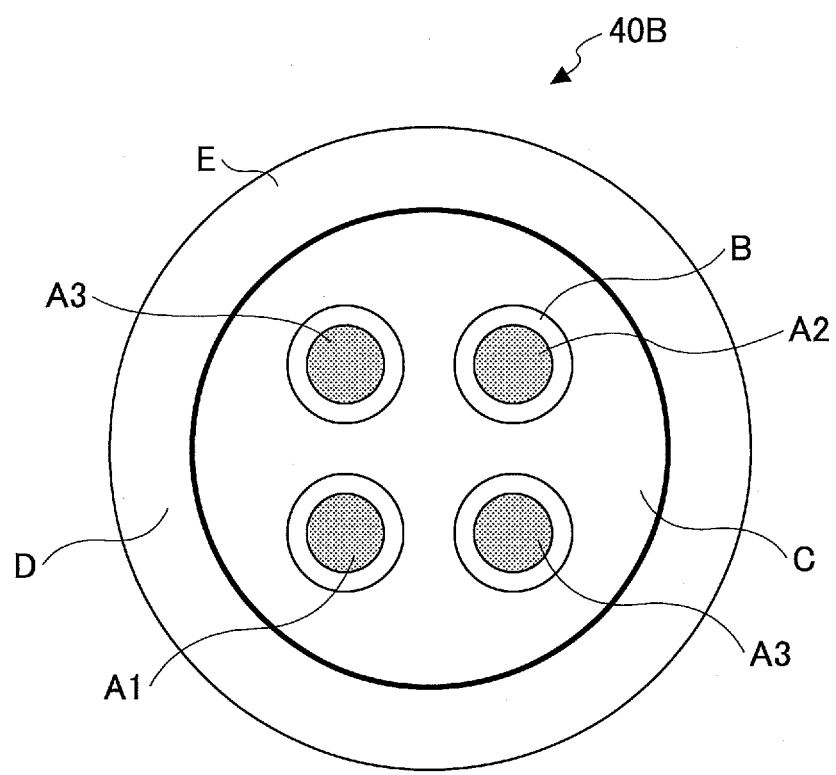
FIG. 19 is a diagram illustrating the composition of a modification of the cable.

Instead of the cable 40 in the above-described embodiment, a cable 40B as illustrated in FIG. 19 may be used. The cable 40B includes two ground lines A3. In this case, the shield material F may be omitted. Although this cable 40B is inexpensive, the cable tends to be influenced by externally radiated noise and tends to emit electromagnetic waves from the cable itself. For this reason, the cable 40B may be arranged to include a twisted pair of one ground line A3 and the analog signal line A1, and a twisted pair of the other ground line A3 and the power supply line A2. In this case, one of the two ground lines A3 may be used as a ground conductor element for taking preventive measures against electromagnetic waves and electrostatic discharge.

Figure 20:
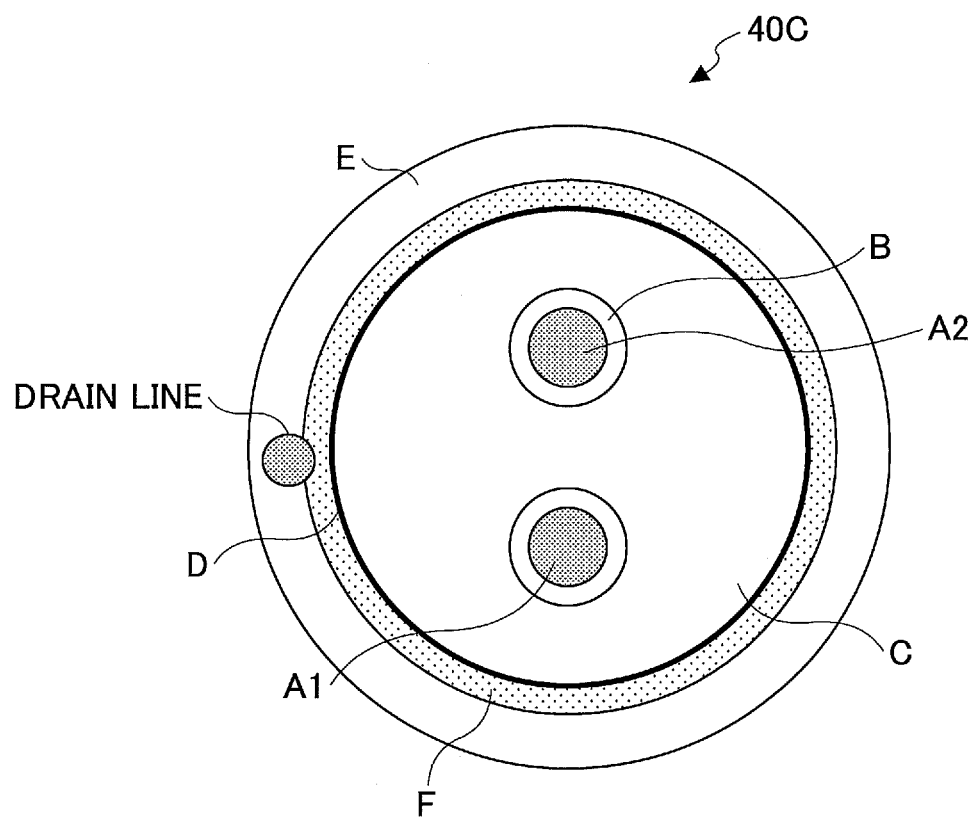
FIG. 20 is a diagram illustrating the composition of a modification of the cable.
Figure 21:
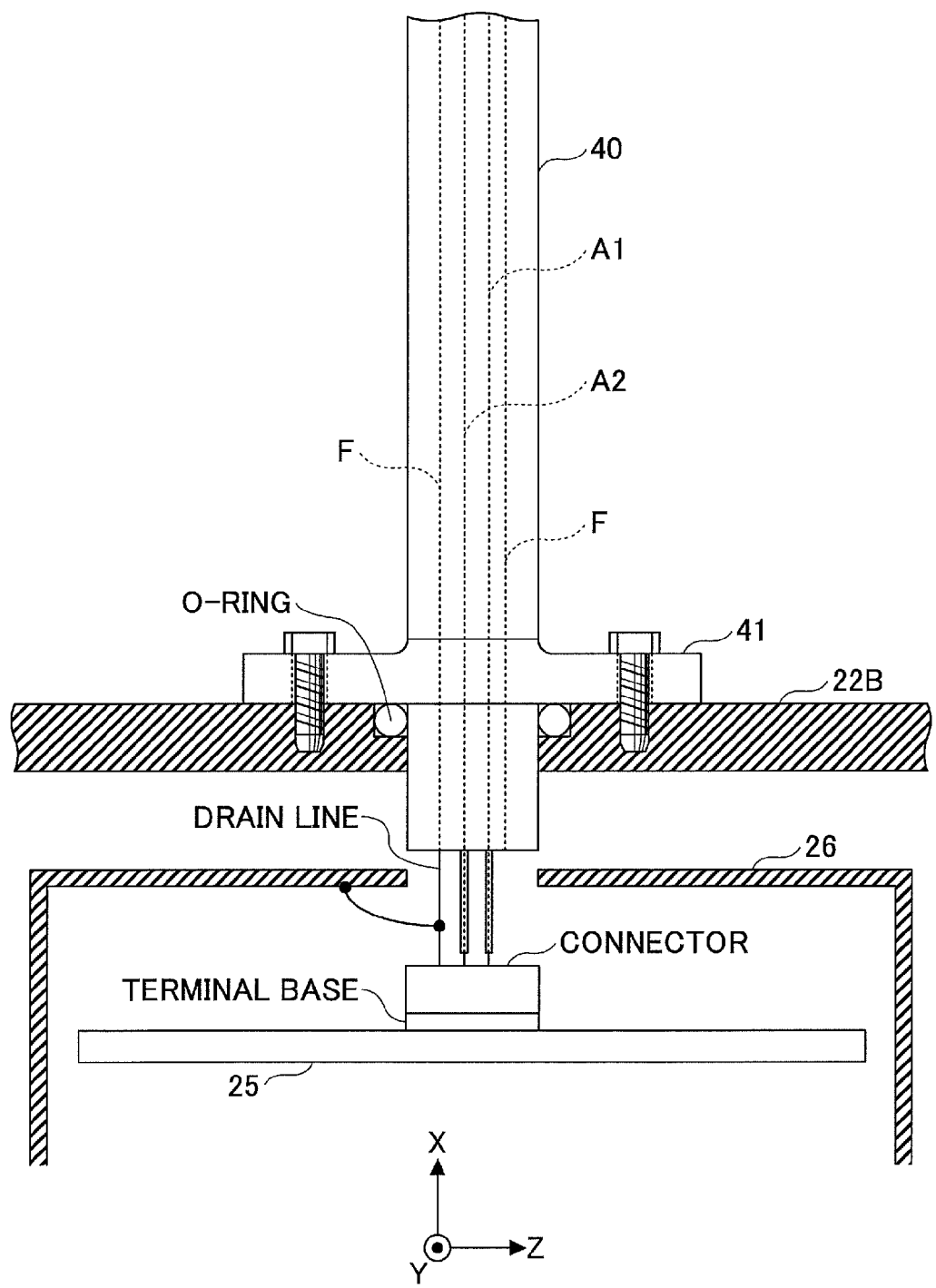
FIG. 21 is a diagram for explaining the condition of an end portion of the cable when the cable of FIG. 20 is used.

Instead of the cable 40 in the above-described embodiment, a cable 40C as illustrated in FIG. 20 may be used. The cable 40C includes no ground line A3. In this case, the drain line in the cable 40C is connected to the ground terminal of the circuit board 25 through the filter circuit as illustrated in FIG. 21. Namely, the drain line may be used as a ground conductor element for taking preventive measures against electromagnetic waves and electrostatic discharge.

In the above-described embodiment, the cable 40 includes a single analog signal line. However, the present disclosure is not limited to this embodiment. For example, the cable 40 may further include two or more control signal lines. These control signal lines may be used to transmit control signals for displaying an enlarged image of a portion of a display image, or for performing initial adjustment of the position for displaying a vehicle width line image superimposed on a display image.

In the above-described embodiment, an analog video signal is output from the in-vehicle camera 20. However, the present disclosure is not limited to this embodiment. For example, a digital video signal may be output from the in-vehicle camera 20. However, in this case, it is necessary that additional signal lines be included in the cable 40. Moreover, it is necessary to provide a signal processor circuit which is in conformity with the digital video signal output from the in-vehicle camera 20.

In the above-described embodiment, the in-vehicle camera 20 is attached to the rear of the vehicle 1 and used for the back monitoring device 10. However, the present disclosure is not limited to this embodiment. For example, the in-vehicle camera 20 may be attached to the front of the vehicle 1 and used for a monitoring device which monitors an image indicating the surroundings of the vehicle 1 at the front thereof. Alternatively, the in-vehicle camera 20 may be attached to the side of the vehicle 1 and used for a monitoring device which monitors an image indicating the surroundings of the vehicle 1 on the side thereof.

In the above-described embodiment, the CMOS image sensor is used as the image sensor of the camera unit. However, the present disclosure is not limited to this embodiment. For example, a CCD (charge-coupled device) image sensor may be used as the image sensor of the camera unit. In this case, a signal processor circuit which is in conformity with the CCD image sensor may be used.

In the above-described embodiment, the lens system 21 is made up of six lenses. However, the present disclosure is not limited to this embodiment.

In the above-described embodiment, the circuit board is made up of a single substrate. However, the present disclosure is not limited to this embodiment. For example, the circuit board may be made up of two or more substrates.

Figure 22:
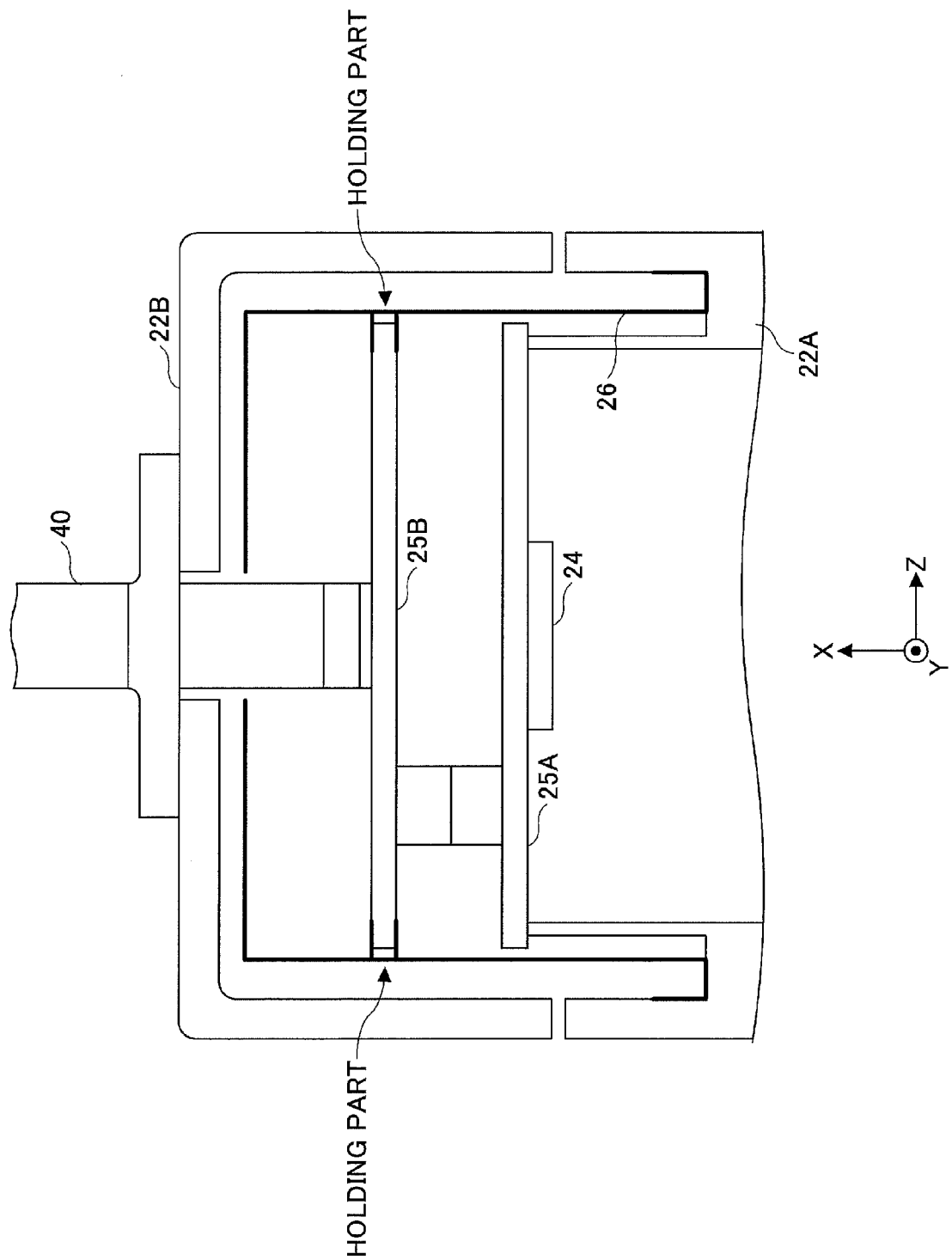
FIG. 22 is a diagram illustrating a modification of a shield plate.

Specifically, as illustrated in FIG. 22, the circuit board may be arranged to include a circuit board 25A and a circuit board 25B, and the shield plate 26 may be include holding parts or holding mechanisms for holding the circuit board 25B.

In the above-described embodiment, the ground line A3 and the drain line are connected together at the end of the cable 40 in the −X direction, and the drain line and the shield plate 26 are connected together by a lead wire. However, the present disclosure is not limited to this embodiment. In this respect, some modifications of the above-described embodiment will be described in the following.

<Modification 1>

Figure 23A:
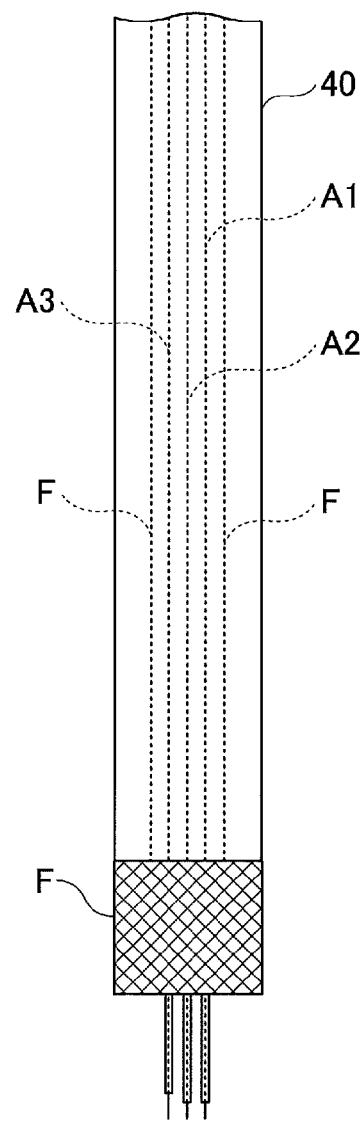
FIG. 23A and FIG. 23B are diagrams illustrating a modification of an end portion of a cable.
Figure 23A:
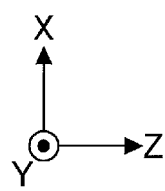
Figure 23B:
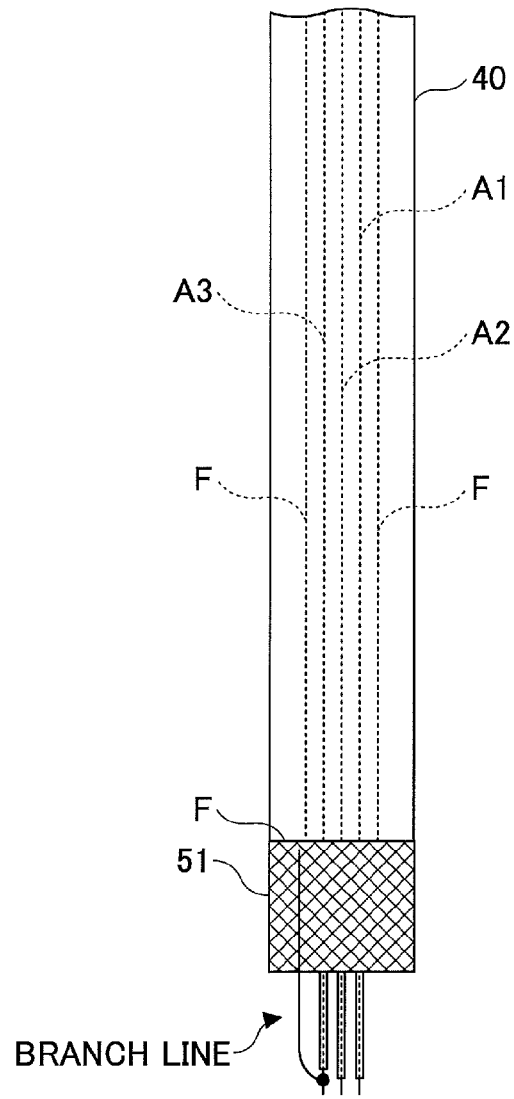

In the modification 1, as illustrated in FIG. 23A, the three insulated wires and the shield material F are exposed at the end of the cable 40 in the −X direction, and the exposed shield material F is turned up so that the insulating material E is enclosed with the turned-up shield material F. As illustrated in FIG. 23B, a branch line from the ground line A3 is provided and the branch line is turned up to the turned-up shield material F.

Figure 24A:
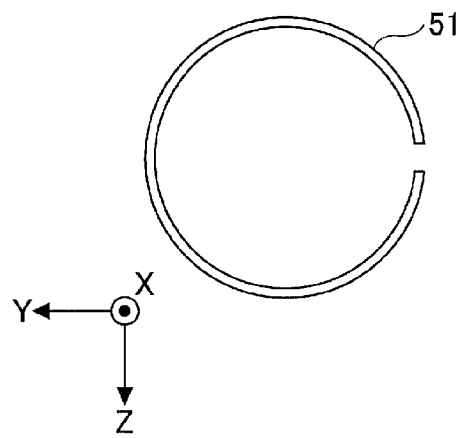
FIG. 24A, FIG. 24B and FIG. 24C are diagrams illustrating the composition of a crimping component which is used for the end portion of the cable of FIG. 23A.
Figure 24B:
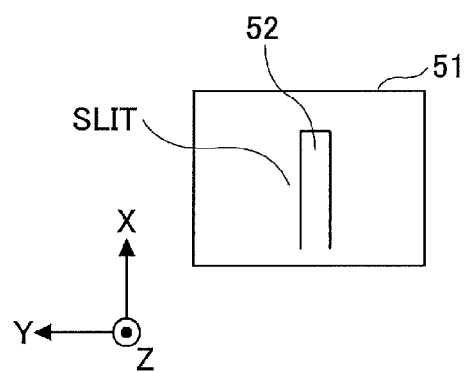
Figure 24C:
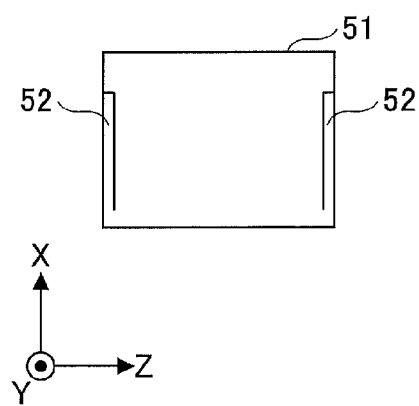
Figure 25:
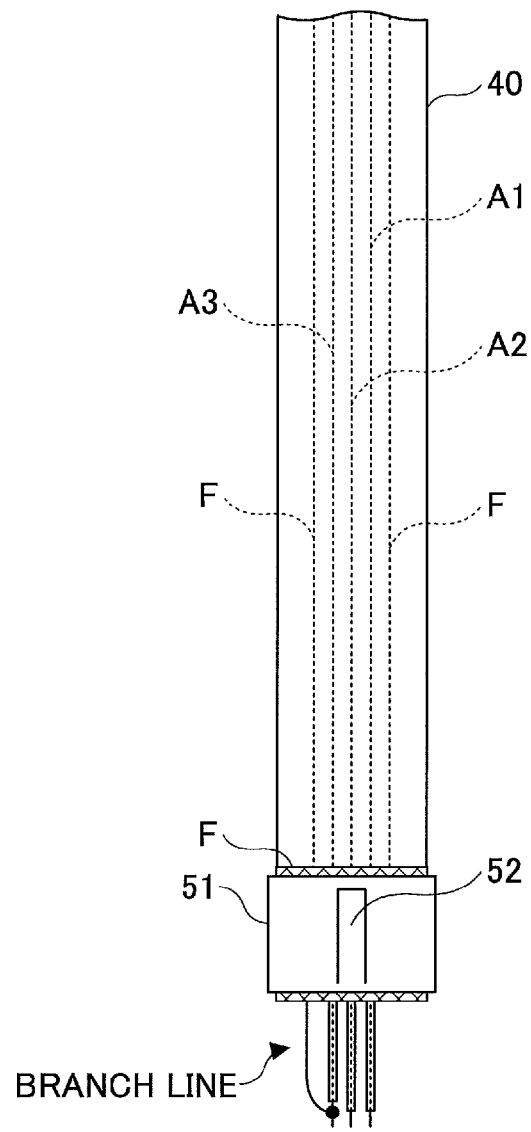
FIG. 25 is a diagram illustrating the composition of the modification of the end portion of the cable of FIG. 23A.
Figure 25:
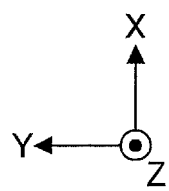

As illustrated in FIG. 25, a metal component 51 is crimped to the end of the cable 40 so that the branch line and the turned-up shield material F are contained in and electrically connected to each other by the metal component 51. As illustrated in FIGS. 24A to 24C, the metal component 51 includes rectangular portions 52 at two locations on the circumference thereof, each of which is formed into a slit with three cut portions. The metal component 51 is made of a resilient metallic material.

Figure 26A:
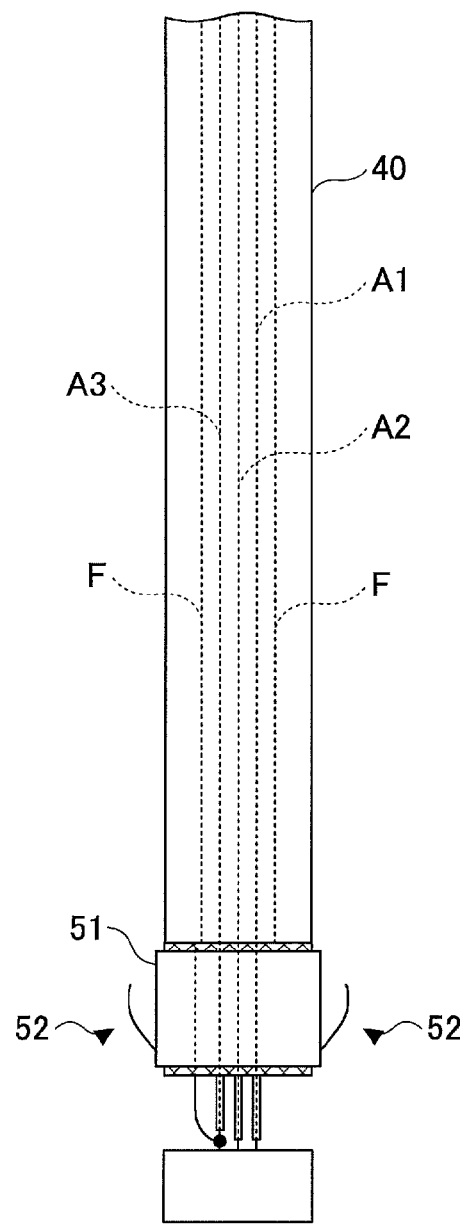
FIG. 26A and FIG. 26B are diagrams illustrating the composition of the modification of the end portion of the cable of FIG. 23A.
Figure 26A:
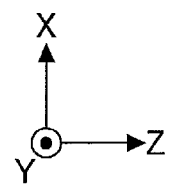
Figure 26B:
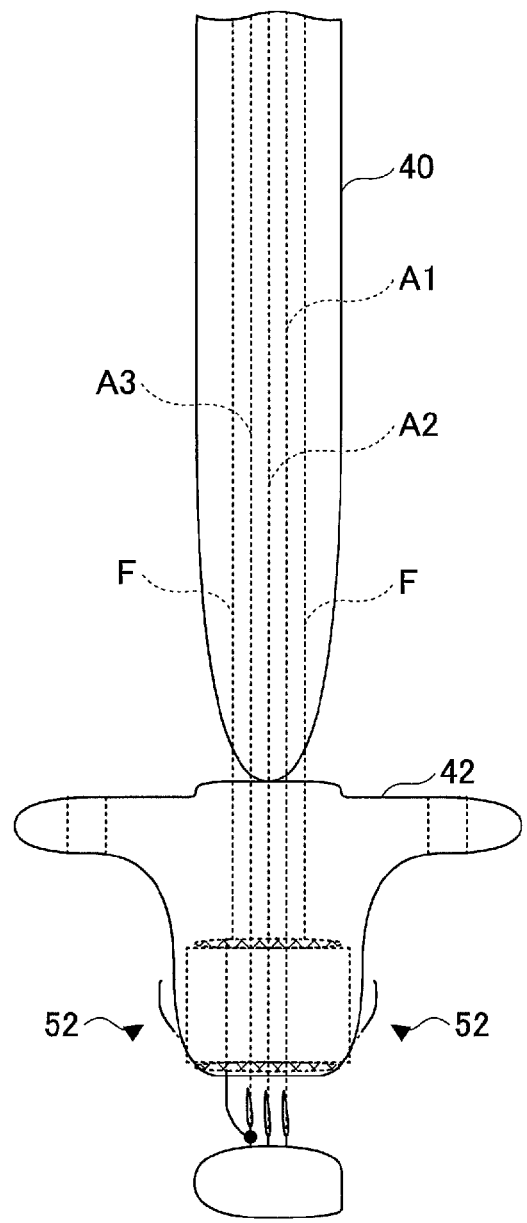
Figure 26B:
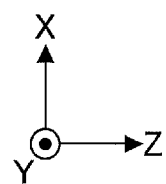

As illustrated in FIG. 26A, each of the rectangular portions 52 of the metal component 51 is bent outward. As illustrated in FIG. 26B, a block 42 which is made of a resin molding and includes two through holes is bonded to a portion of the cable 40 in the vicinity of the end of the cable 40, with the bent part of each rectangular portion 52 being exposed from the block 42.

Figure 27:
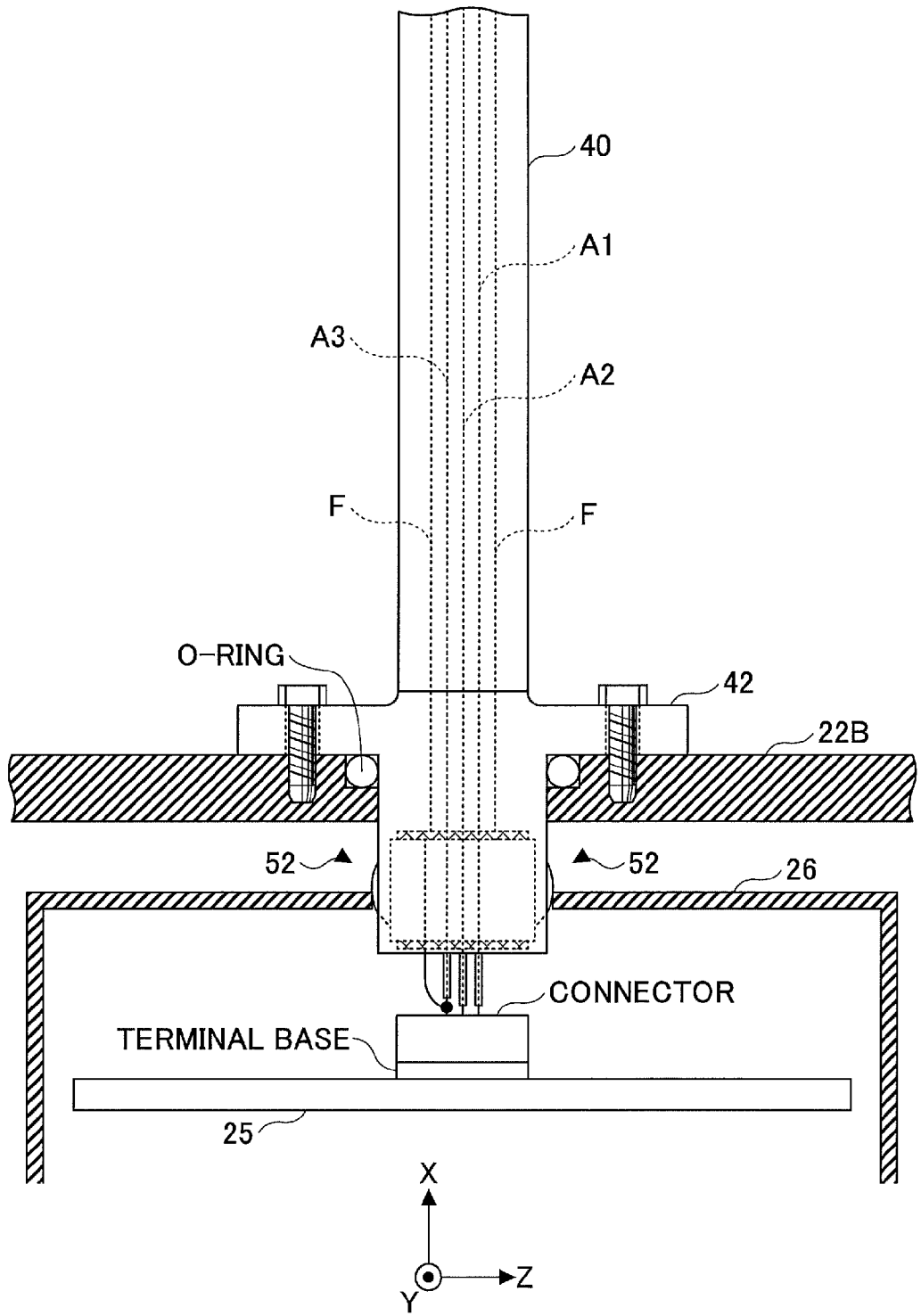
FIG. 27 is a diagram illustrating the composition of the modification of the end portion of the cable of FIG. 23A.

In this case, as illustrated in FIG. 27, when attaching the cable 40 to the in-vehicle camera 20, the rectangular portions 52 of the metal component 51 are in contact with the shield plate 26 by simply inserting the end of the cable 40 in the −X direction into the camera housing 22. Namely, the shield plate 26, the shield material F, and the ground line A3 can be electrically connected to the ground terminal (GND) of the circuit board 25 through the filter unit. In this case, the metal component 51 may provide a resistance to removal of the cable 40.

<Modification 2>

Figure 28A:
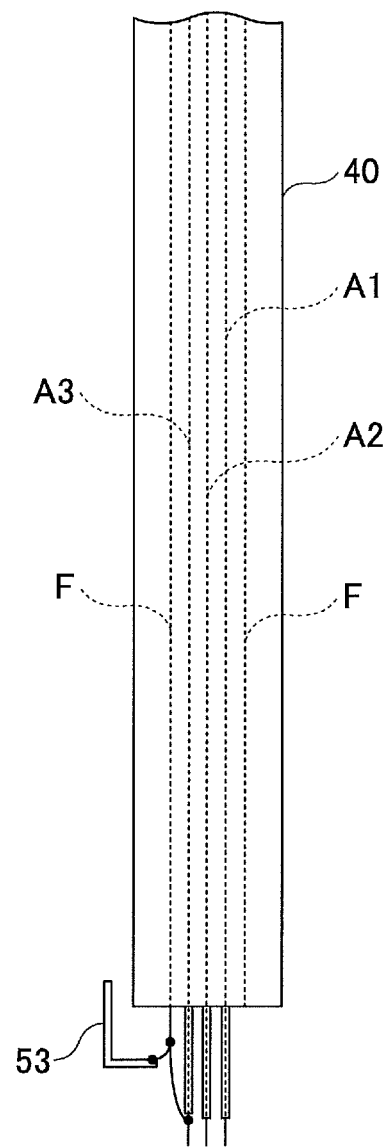
FIG. 28A and FIG. 28B are diagrams illustrating a modification of the end portion of the cable.
Figure 28A:
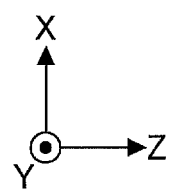

In the modification 2, as illustrated in FIG. 28A, the ground line A3 and the drain line are connected together at the end of the cable 40 in the −X direction, and the drain line and an L-shaped metal plate 53 are connected together by a lead wire.

Figure 28B:
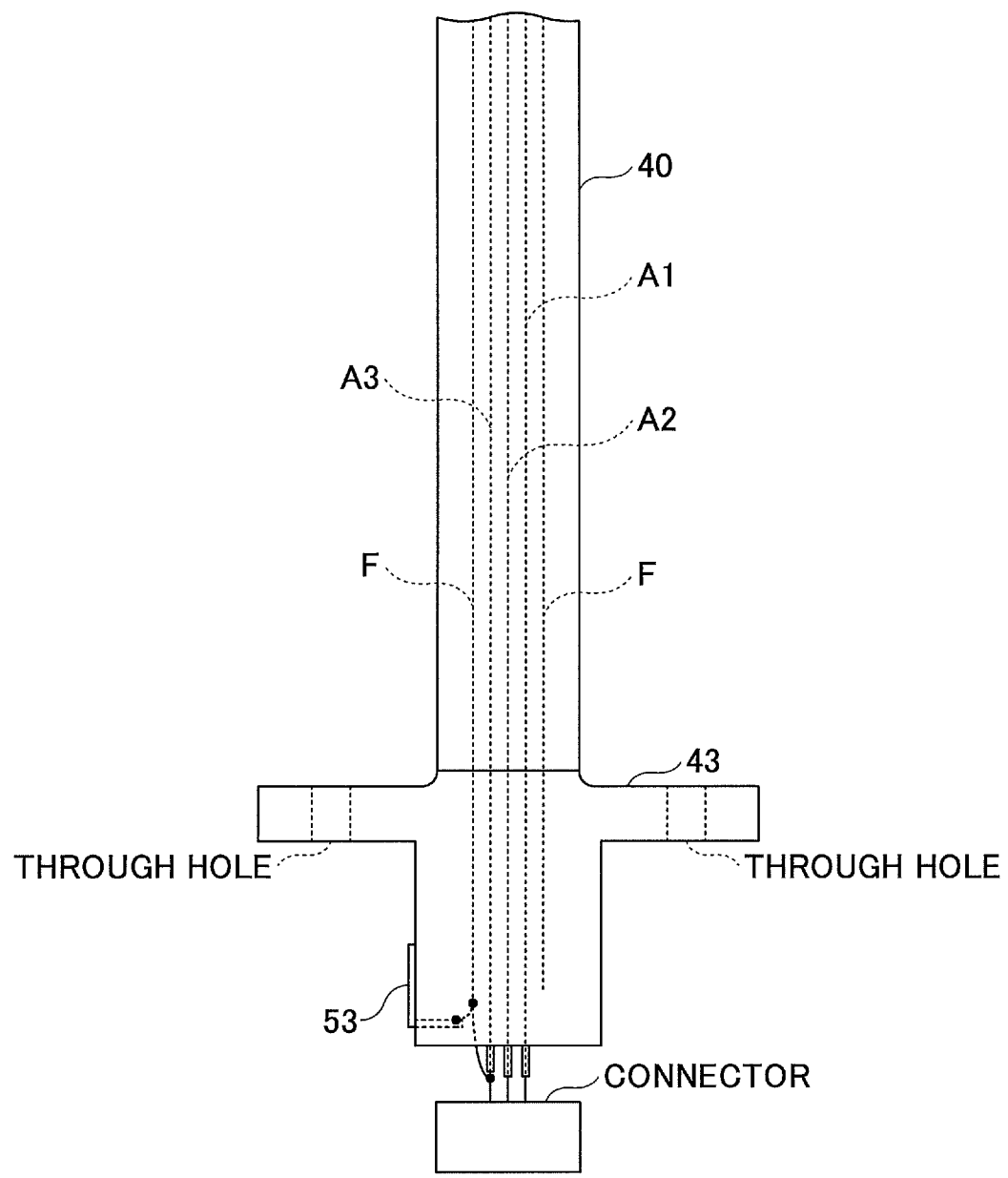

As illustrated in FIG. 28B, a block 43 which is made of a resin molding and includes two through holes is bonded to a portion of the cable 40 in the vicinity of the end of the cable 40 with a part of the metal plate 53 being exposed. In this example, the outside surface of the metal plate 53 in the −Z direction is exposed.

Figure 29:
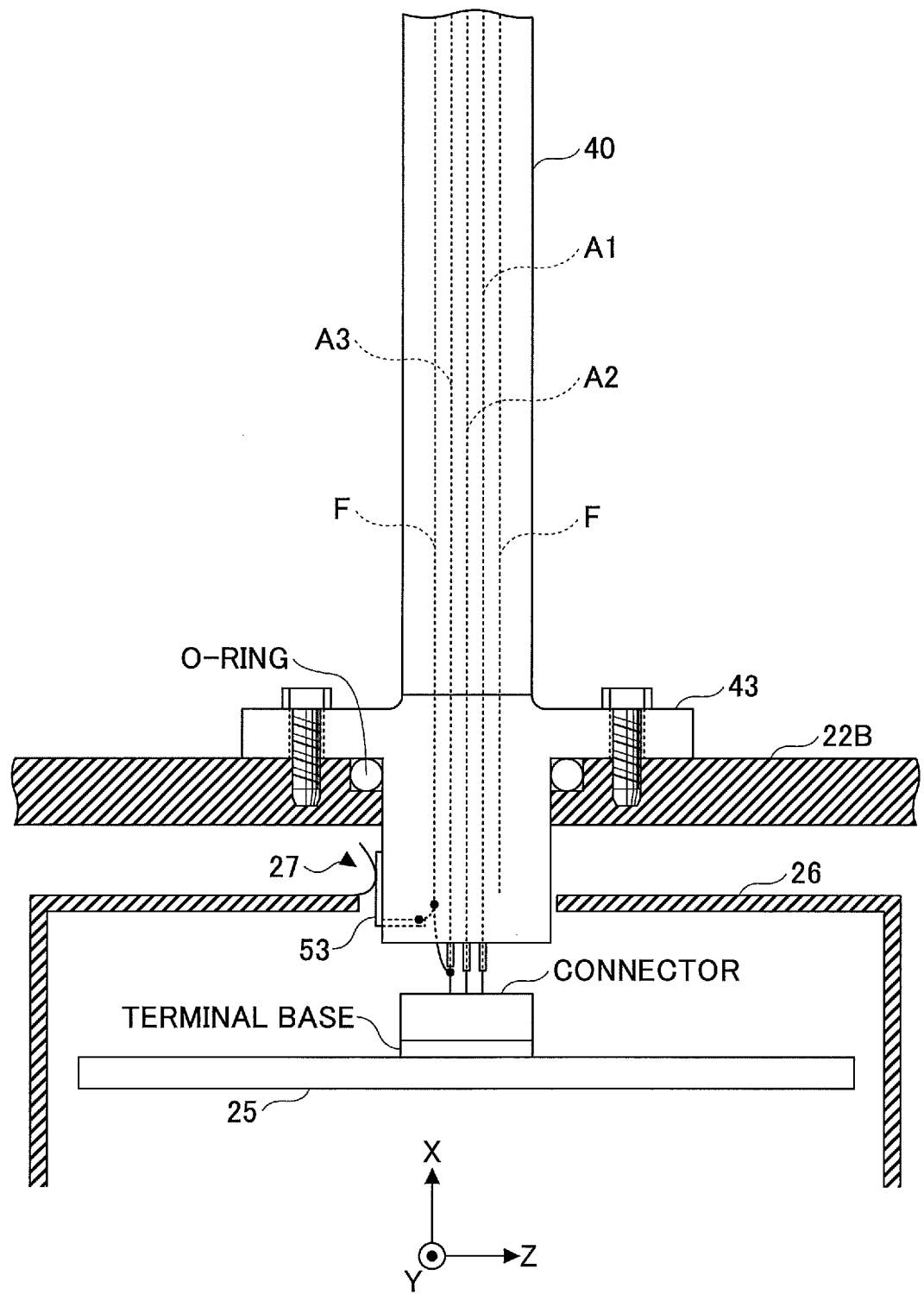
FIG. 29 is a diagram illustrating the modification of the end portion of the cable FIG. 28A.

As illustrated in FIG. 29, the shield plate 26 in this case is formed with a leaf spring 27, and when the cable 40 is attached to the in-vehicle camera 20, the metal plate 53 and the leaf spring 27 of the shield plate 26 are in contact with each other by simply inserting the end of the cable 40 in the −X direction into the camera housing 22. Namely, the shield plate 26, the shield material F, and the ground line A3 can be electrically connected to the ground terminal (GND) of the circuit board 25 through the filter unit. In this case, the metal plate 53 has a simple configuration, and the cable processing and the handling of the cable 40 can be performed easily. The metal plate 53 may be formed to have a flat surface which is in contact with the leaf spring 27 of the shield plate 26.

<Modification 3>

Figure 30A:
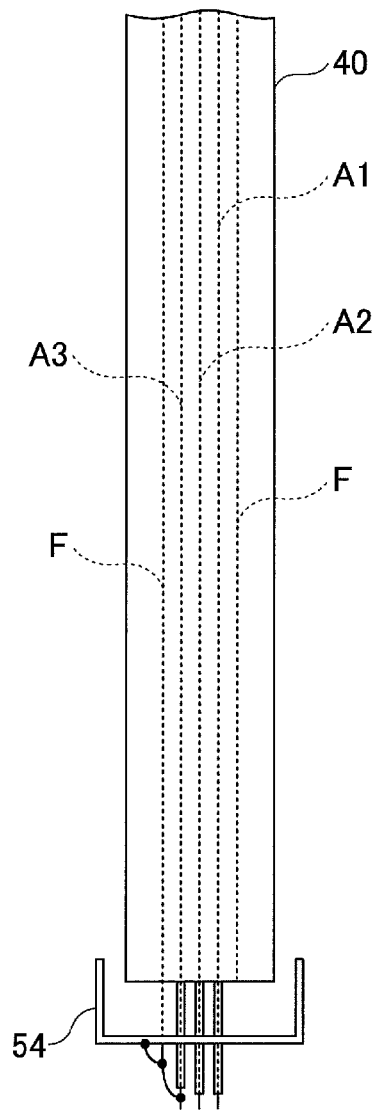
FIG. 30A and FIG. 30B are diagrams illustrating a modification of the end portion of the cable.
Figure 30A:
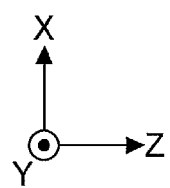
Figure 30B:
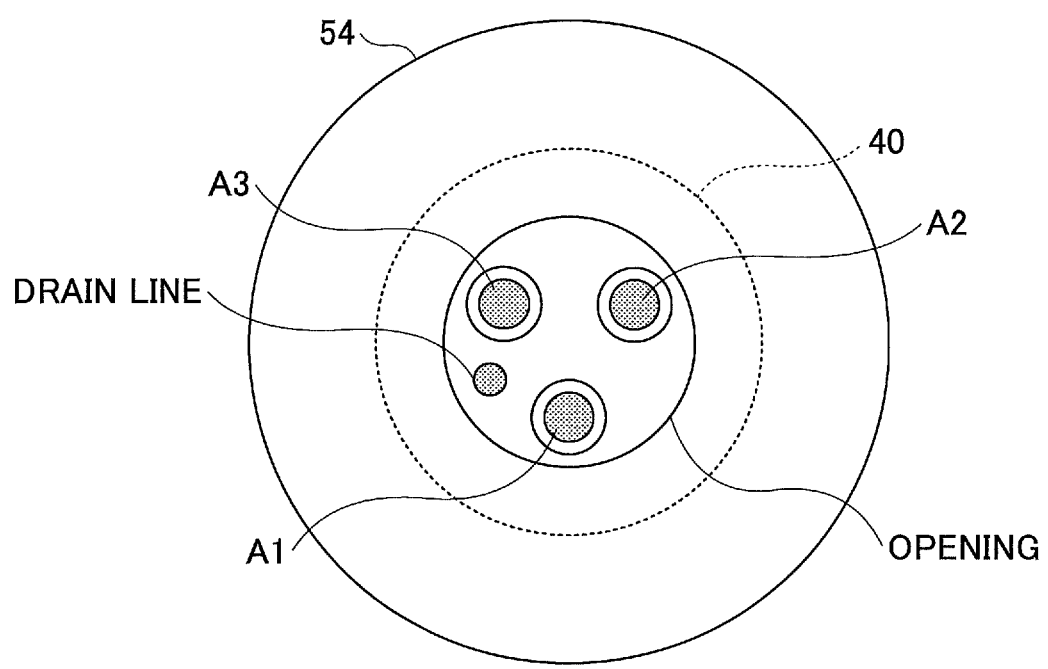

In the modification 3, as illustrated in FIGS. 30A and 30B, a cap-like metal component 54 including an opening which the three insulated wires and the drain line pass through at the end of the cable 40 in the −X direction is used.

In the modification 3, the ground line A3 and the drain line are connected together at the end of the cable 40 in the −X direction, and the drain line and the metal component 54 are connected together by a lead wire.

Figure 31:
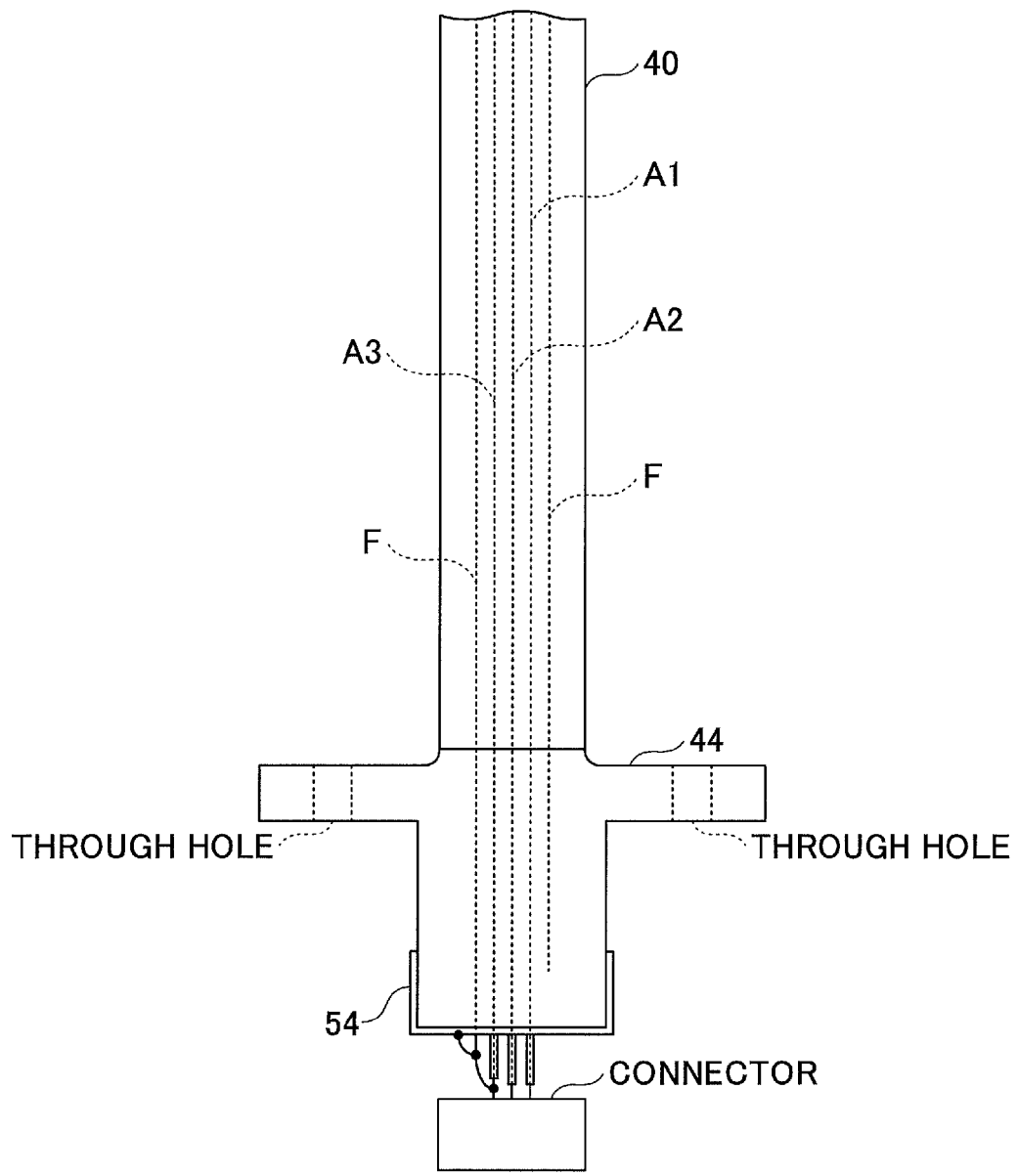
FIG. 31 is a diagram illustrating the modification of the end portion of the cable of FIG. 30A.

As illustrated in FIG. 31, a block 44 which is made of a resin molding and includes two through holes is bonded to a portion of the cable 40 in the vicinity of the end of the cable 40 with the surface of the metal component 54 being exposed.

Figure 32:
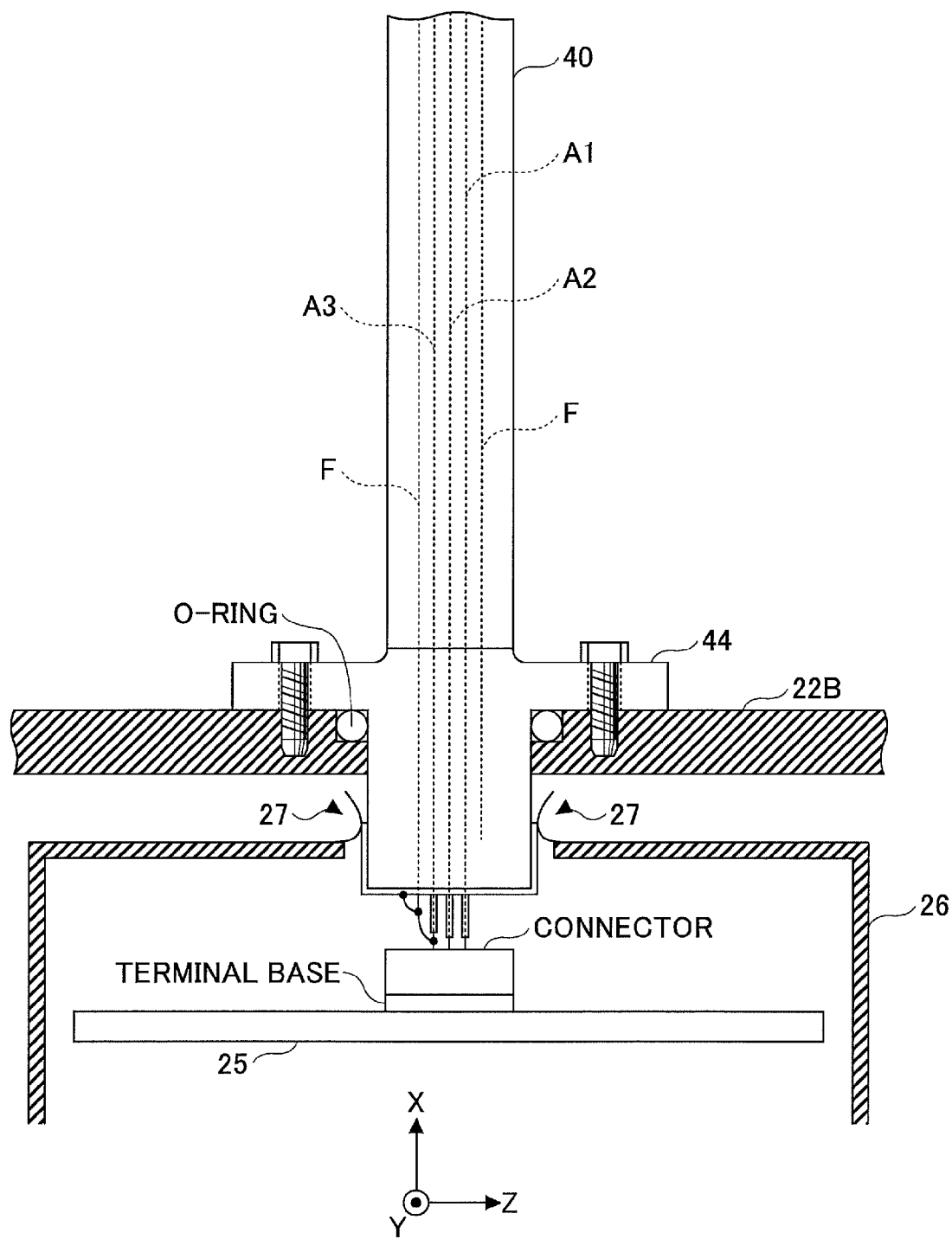
FIG. 32 is a diagram illustrating the modification of the end portion of the cable of FIG. 30A.

In this case, as illustrated in FIG. 32, the shield plate 26 is formed with leaf springs 27, and when the cable 40 is attached to the in-vehicle camera 20, the metal component 54 and the leaf springs 27 of the shield plate 26 are in contact with each other by simply inserting the end of the cable 40 in the −X direction into the camera housing 22. Namely, the shield plate 26, the shield material F, and the ground line A3 can be electrically connected to the ground terminal (GND) of the circuit board 25 through the filter unit. In this case, there is no clearance except for the opening of the metal component 54 which the three insulated wires and the drain line pass through, and it is possible to provide increased shielding performance of electromagnetic waves.

The shield plate 26 may be formed with three or more leaf springs 27 in order to improve the shielding performance of electromagnetic waves. In this case, the metal component 54 may be arranged to include the rectangular portions which are the same as those in the above-described modification 1. At this time, the leaf springs 27 of the shield plate 26 may be omitted.

<Modification 4>

Figure 33:
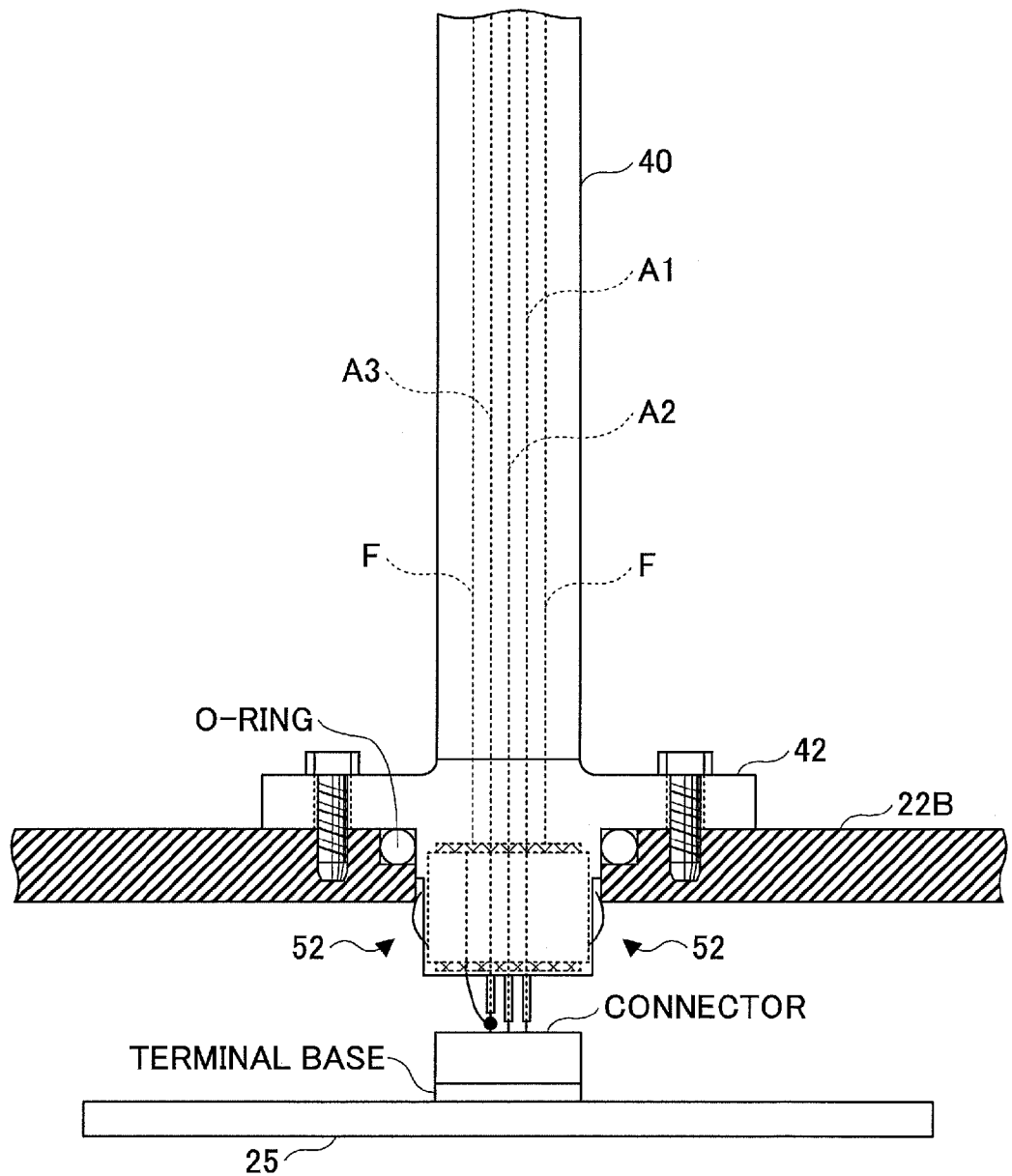
FIG. 33 is a diagram illustrating a modification of the end portion of the cable.

In the modification 4, the end of the cable 40 in the −X direction is essentially the same as that in the above-described modification 1, and the camera housing 22 is made of a metallic material. As illustrated in FIG. 33, when attaching the cable 40 to the in-vehicle camera 20, the rectangular portions 52 of the metal component 51 and the rear case 22B are in contact with each other by simply inserting the end of the cable 40 in the −X direction into the camera housing 22. Namely, the rear case 22B, the shield material F, and the ground line A3 can be electrically connected to the ground terminal (GND) of the circuit board through the filter unit.

When painting is performed on the outer surface of the camera housing, it is preferred that the painting process is not performed for the portions of the camera housing which are to be contacted by the rectangular portions 52, and a plating process is performed for such portions.

<Modification 5>

Figure 34:
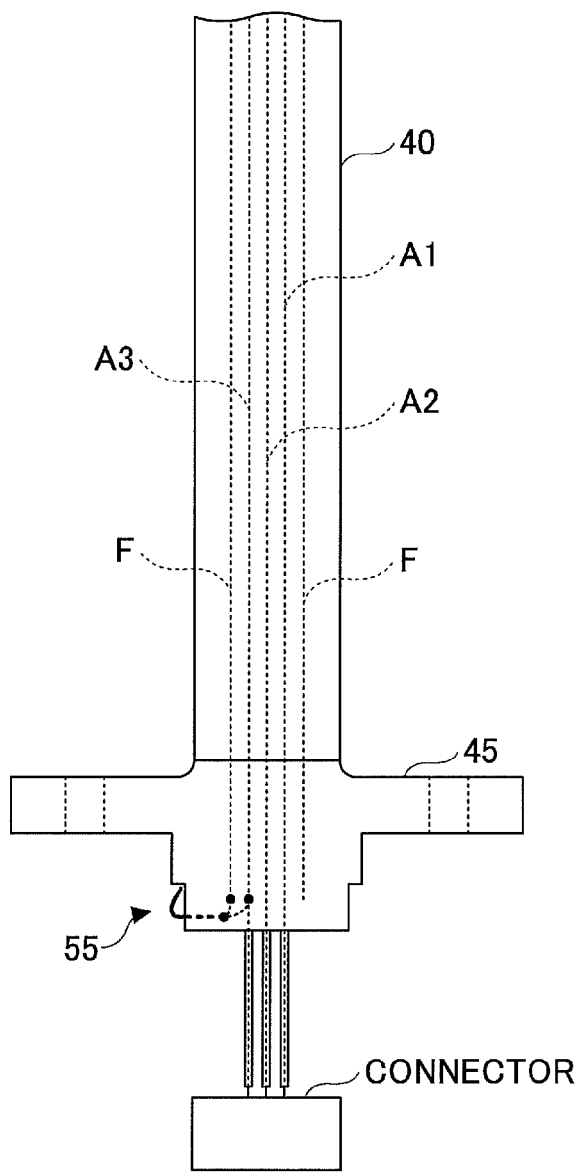
FIG. 34 is a diagram illustrating a modification of the end portion of the cable.

In the modification 5, as illustrated in FIG. 34, a spring component 55 to which the ground line A3 and the drain line are connected by lead wires at the end of the cable 40 in the −X direction is used. A block 45 which is made of a resin molding and includes two through holes is bonded to a portion of the cable 40 in the vicinity of the end of the cable 40 with a part of the spring component 55 being exposed from the block 45.

Figure 35:
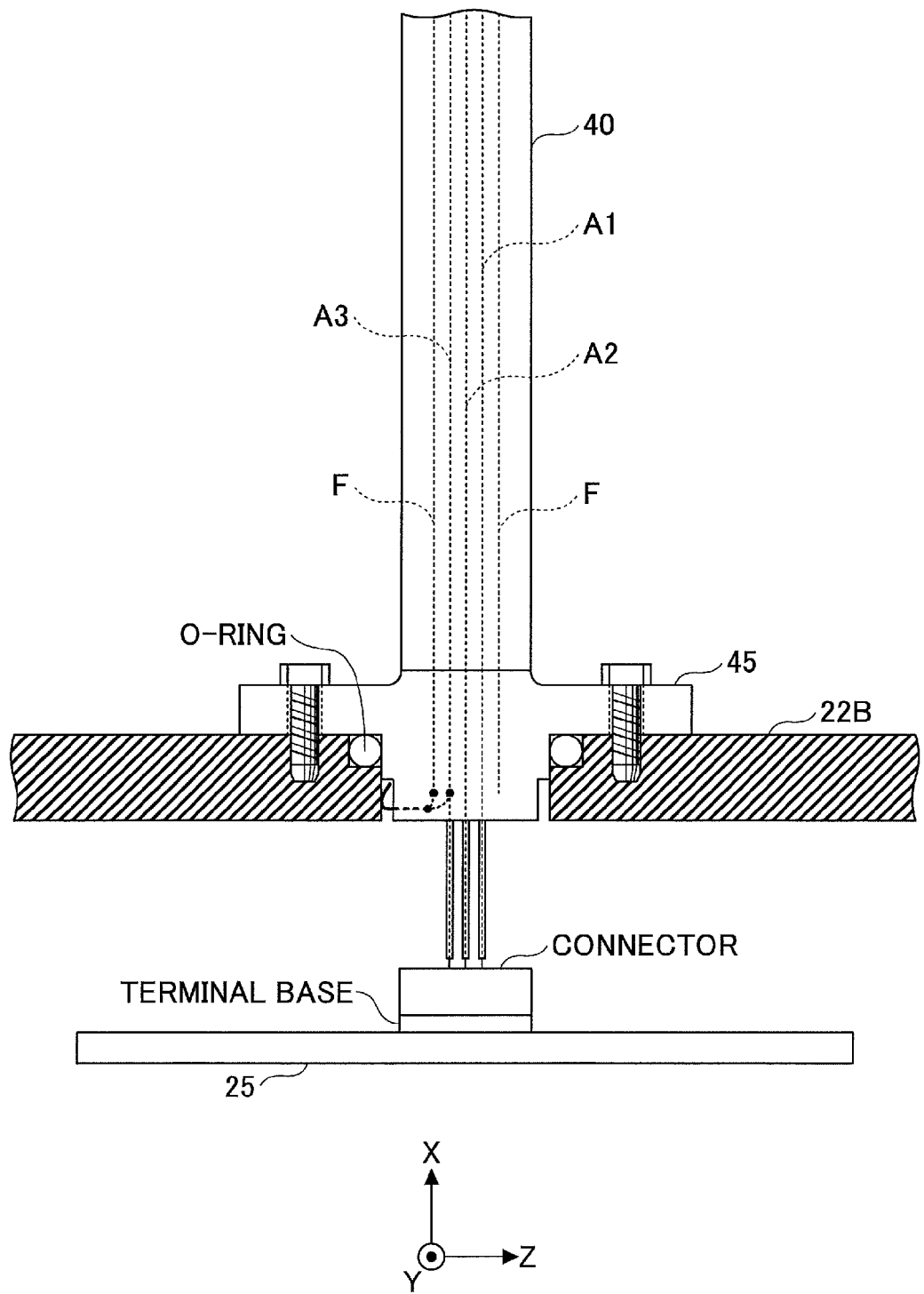
FIG. 35 is a diagram illustrating the modification of the end portion of the cable of FIG. 34.

In this case, the camera housing 22 is made of a metallic material, and, as illustrated in FIG. 35, when attaching the cable 40 to the in-vehicle camera 20, the spring component 55 and the rear case 22B are in contact with each other by simply inserting the end of the cable 40 in the −X direction into the camera housing 22. Namely, the rear case 22B, the shield material F, and the ground line A3 can be electrically connected to the ground terminal (GND) of the circuit board through the filter unit.

In the above-described embodiment, the insulated wires are exposed from the end of the cable 40. Alternatively, the insulated wires at the end of the cable 40 and an FPC (flexible printed circuit) may be connected together within a block made of a resin molding and the wiring in the FPC may be arranged in the block. In this case, the space for the wiring can be reduced.

In the above-described embodiment, the plural lenses are held in the front case. Alternatively, the plural lenses may be held in a lens-barrel, and the lens-barrel may be attached to the front case.

As described in the foregoing, according to the present disclosure, it is possible to provide a camera unit which can provide high resistance to electrostatic discharge and good shielding performance of electromagnetic waves with low cost. According to the present disclosure, it is possible to provide a sensing device which can provide increased reliability with low cost.

The present disclosure is not limited to the above-described embodiments, and variations and modifications may be made without departing from the scope of the present invention.

What is claimed is:

1. A camera unit comprising:
   an image sensor;
   a circuit board in which a signal processor circuit to process an output signal of the image sensor is formed;
   a cable including at least a signal conductor element and a ground conductor element and connected at one end to the circuit board;
   a metal housing component to accommodate the image sensor and the circuit board therein; and
   a metal component disposed at the end of the cable and connected to the ground conductor element, wherein the ground conductor element is connected to both a ground terminal of the circuit board and the metal housing component in a vicinity of the end of the cable where the cable is connected to the circuit board, and
   wherein the ground conductor element is connected to the metal housing component through the metal component in the vicinity of the end of the cable, and
   wherein the cable further includes a ground line and the ground line is connected to the ground conductor element in the vicinity of the end of the cable.

2. The camera unit according to claim 1, wherein the metal component is fixed to a portion of the cable in the vicinity of the end of the cable in a state in which the metal component is connected to the ground conductor element, and the metal component including a contact portion which is in contact with the metal housing component when the cable is connected to the circuit board.

3. The camera unit according to claim 1, wherein the metal component is fixed to a portion of the cable in the vicinity of the end of the cable in a state in which the metal component is connected to the ground conductor element, and the metal housing component including a contact portion which is contacted by the metal component when the cable is connected to the circuit board.

4. The camera unit according to claim 1, wherein the metal component has a cap-like configuration and is formed to enclose the end of the cable therewith, and an opening being formed in a bottom surface of the metal component, and the signal conductor element and the ground conductor element passing through the opening of the metal component.

5. The camera unit according to claim 1, wherein the image sensor is an image sensor with a built-in lens system.

6. The camera unit according to claim 1, wherein the image sensor is a CMOS image sensor.

7. The camera unit according to claim 1, wherein the image sensor is a CCD image sensor.

8. The camera unit according to claim 1, wherein the cable has a block having through holes in which screws are inserted so as to fix the block to the metal housing component.

9. The camera unit according to claim 1, wherein the circuit board further includes a filter circuit, and the ground conductor element is connected to the ground terminal of the circuit board through the filter circuit.

10. A sensing device comprising:
a camera unit to capture an image indicating surroundings of the camera unit; and
a display unit to display image information based on an output signal of the camera unit,
the camera unit comprising:
an image sensor;
a circuit board in which a signal processor circuit to process an output signal of the image sensor is formed;
a cable including at least a signal conductor element and a ground conductor element and connected at one end to the circuit board;
a metal housing component to accommodate the image sensor and the circuit board therein; and
a metal component disposed at the end of the cable and connected to the ground conductor element, wherein the ground conductor element is connected to both a ground terminal of the circuit board and the metal housing component in a vicinity of the end of the cable where the cable is connected to the circuit board, and
wherein the ground conductor element is connected to the metal housing component through the metal component in the vicinity of the end of the cable, and
wherein the cable further includes a ground line and the ground line is connected to the ground conductor element in the vicinity of the end of the cable.

11. The sensing device according to claim 10, further comprising a memory unit to store the output signal of the camera unit.

12. The sensing device according to claim 10, wherein the sensing device is installed in a vehicle and comprises a monitoring control device to determine whether there is a danger based on the output signal of the camera unit, the monitoring control device outputting alarm information to the display unit when it is determined that there is a danger.

* * * * *